United States Patent
Xie et al.

(10) Patent No.: US 12,021,546 B2
(45) Date of Patent: Jun. 25, 2024

(54) METHOD AND APPARATUS FOR IMPROVED BELIEF PROPAGATION BASED DECODING

(71) Applicant: Telefonaktiebolaget LM Ericsson (publ), Stockholm (SE)

(72) Inventors: Ailing Xie, Beijing (CN); Yushi Zhang, Beijing (CN)

(73) Assignee: TELEFONAKTIEBOLAGET LM ERICSSON (PUBL), Stockholm (SE)

(*) Notice: Subject to any disclaimer, the term of this patent is extended or adjusted under 35 U.S.C. 154(b) by 0 days.

(21) Appl. No.: 18/022,215

(22) PCT Filed: Sep. 3, 2020

(86) PCT No.: PCT/CN2020/113243
§ 371 (c)(1),
(2) Date: Feb. 20, 2023

(87) PCT Pub. No.: WO2022/047699
PCT Pub. Date: Mar. 10, 2022

(65) Prior Publication Data
US 2024/0014828 A1    Jan. 11, 2024

(51) Int. Cl.
*H03M 13/11* (2006.01)
(52) U.S. Cl.
CPC .............. *H03M 13/1111* (2013.01)
(58) Field of Classification Search
None
See application file for complete search history.

(56) References Cited

U.S. PATENT DOCUMENTS

2005/0193320 A1* 9/2005 Varnica ............. H03M 13/3723
714/800
2005/0257116 A1* 11/2005 Zarrinkhat ......... H03M 13/1148
714/755

(Continued)

FOREIGN PATENT DOCUMENTS

| CN | 105634507 A | 6/2016 |
| CN | 108847848 A | 11/2018 |
| WO | 2021007751 A1 | 1/2021 |

OTHER PUBLICATIONS

International Search Report and the Written Opinion of the International Searching Authority, issued in corresponding International Application No. PCT/CN2020/113243, dated May 26, 2021, 10 pages.

(Continued)

*Primary Examiner* — Daniel F. McMahon
(74) *Attorney, Agent, or Firm* — Rothwell, Figg, Ernst & Manbeck, P.C.

(57) ABSTRACT

Various embodiments of the present disclosure provide methods and apparatuses for improved belief propagation (BP) decoding. A method performed by a receiver comprises: obtaining based on received information and an original left-to-right table comprising left-to-right messages associated with nodes of a plurality of processing elements (PEs) for BP decoding, an original right-to-left table comprising right-to-left messages associated with the nodes, and searching for, based on the original left-to-right table and the original right-to-left table, a conflict verification processing element (VPE) in the plurality of PE. The method also comprises updating the original right-to-left table based on the conflict VPE to obtain a plurality of potential right-to-left tables, and performing the BP decoding based on the respective one of the plurality of potential right-to-left tables.

19 Claims, 23 Drawing Sheets

(56) References Cited

U.S. PATENT DOCUMENTS

| | | | |
|---|---|---|---|
| 2006/0190799 A1* | 8/2006 | Kan | H03M 13/3746 714/758 |
| 2009/0013237 A1* | 1/2009 | Lin | H03M 13/1111 714/776 |
| 2010/0251059 A1* | 9/2010 | Dielissen | H03M 13/1168 714/752 |
| 2011/0029756 A1* | 2/2011 | Biscondi | H03M 13/616 714/752 |
| 2011/0179333 A1* | 7/2011 | Wesel | H03M 13/1111 714/752 |
| 2012/0131309 A1* | 5/2012 | Johnson | G06F 8/40 712/E9.004 |
| 2013/0117344 A1* | 5/2013 | Gross | H03M 13/6563 708/490 |
| 2014/0153625 A1* | 6/2014 | Vojcic | H03M 13/3746 375/340 |
| 2015/0026546 A1 | 1/2015 | Reynolds et al. | |
| 2015/0067440 A1* | 3/2015 | Owen | H03M 13/1111 714/758 |
| 2015/0124908 A1* | 5/2015 | Luo | H03M 13/1111 375/340 |
| 2015/0333775 A1 | 11/2015 | Korb et al. | |
| 2020/0127686 A1* | 4/2020 | Heo | H03M 13/458 |
| 2021/0218498 A1* | 7/2021 | Effros | H03M 13/63 |
| 2021/0376863 A1* | 12/2021 | Chiueh | H03M 13/458 |
| 2022/0284007 A1* | 9/2022 | Xie | H03M 13/1117 |

OTHER PUBLICATIONS

Intel Corporation "LSPC design for data channel" 3GPP RAN WG1 Meeting #87, R1-1612586, Reno Nevada, Nov. 14—Nov. 18, 2016, 7 pages.

Ankan et al. "Channel polarization: A method for constructing capacity-achieving codes for symmetric binary-input memoryless channels" arXiv:0807.3917v1 [cs.IT] Jul. 24, 2008, 44 pages.

Bioglio et al. "Design of Polar Codes in 5G New Radio" arXiv:1804.04389v1 [cs.IT] Apr. 12, 2018, 9 pages.

Ankan "Polar codes: A pipelined implementation" Presented at "4th International Symposium on Broadband Communication (ISBC 2010), Jul. 11-14, 2010, Melaka, Malaysia".

Elkelesh et al. "Belief Propagation List Decoding of Polar Codes" 1536 IEEE Communications Letters, vol. 22, No. 8, Aug. 2018, pp. 1558-2558.

Pillet, et al., "Scan List Decoding of Polar Codes", ICC 2020—2020 IEEE International Conference On Communications (ICC), IEEE, Jun. 7, 2020 (Jun. 7, 2020), pp. 1-6, XP033798213 (6 pages).

Zhang, et al., "Early stopping criterion for belief propagation polar decoder based on frozen bits", Electronics Letters, the Institution of Engineering and Technology, GB, vol. 53, No. 24, Nov. 23, 2017 (Nov. 23, 2017), pp. 1576-1578, XP006064282 (2 Pages).

* cited by examiner

METHOD AND APPARATUS FOR IMPROVED BELIEF PROPAGATION BASED DECODING

CROSS REFERENCE TO RELATED APPLICATION(S)

This application is a 35 U.S.C. § 371 National Phase Entry Application of PCT/CN2020/113243, filed Sep. 3, 2020, designating the United States, the disclosure of which is incorporated herein by reference in its entirety.

FIELD OF THE INVENTION

The present disclosure generally relates to wireless communications, and more specifically, to a method and apparatus for improved belief propagation (BP) based decoding.

BACKGROUND

This section introduces aspects that may facilitate a better understanding of the disclosure. Accordingly, the statements of this section are to be read in this light and are not to be understood as admissions about what is in the prior art or what is not in the prior art.

Polar code has attracted much attention since its birth in 2008. It can achieve Shannon capacity with very simple encoding and decoding. In recently released 3GPP technical specification, polar coding has been adopted as channel coding for a control channel in case of enhanced mobile broadband (eMBB) service. There are two major domains of decoding schemes for polar code: Successive Cancellation (SC) based decoding and Belief Propagation (BP) based decoding.

For the SC based decoding, Successive Cancellation List (SCL) decoding was introduced which can achieve maximum likelihood (ML) bound with sufficiently large list size. For the BP based decoding, Belief Propagation List (BPL) decoding was proposed which can improve performance of the BP based decoding.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

The present disclosure proposes an improved BP based decoding solution, which may be referred to as Belief Propagation Conflict Search List (BPCSL) decoding.

According to a first aspect of the present disclosure, there is provided a method performed by a receiver. The method comprises obtaining based on received information and an original left-to-right table comprising left-to-right messages associated with nodes of a plurality of processing elements (PEs) for BP decoding, an original right-to-left table comprising right-to-left messages associated with the nodes, and searching for, based on the original left-to-right table and the original right-to-left table, a conflict verification processing element (VPE) in the plurality of PE. The conflict VPE is a VPE for which the left-to-right messages associated with the most-left nodes affecting the left-to-right message associated with its left-upper node indicate frozen bits and the left-to-right messages associated with the most-left nodes affecting the left-to-right message associated with its left-lower node indicate frozen bits and information bits, and has a negative sign for the right-to-left message associated with its left-upper node. The method also comprises updating the original right-to-left table based on the conflict VPE to obtain a plurality of potential right-to-left tables, and performing the BP decoding based on the respective one of the plurality of potential right-to-left tables.

In accordance with an exemplary embodiment, updating the original right-to-left table based on the conflict VPE to obtain a plurality of potential right-to-left tables may comprise modifying, for the conflict VPE and in the original right-to-left table, the sign of the right-to-left message associated with its left-upper node to be positive and the sign of the right-to-left message associated with its right-upper node to be the same as the sign of the right-to-left message associated with its right-lower node, to obtain a first potential right-to-left table, and modifying, for the conflict VPE and in the original right-to-left table, the sign of the right-to-left message associated with its left-upper node to be positive and the sign of the right-to-left message associated with its right-lower node to be the same as the sign of the right-to-left message associated with its right-upper node, to obtain a second potential right-to-left table.

In accordance with an exemplary embodiment, the method may further comprise searching for, in response to no BP decoding based on the respective one of the plurality of potential right-to-left tables being successful, a conflict PE which is connected leftwards to the found conflict VPE and has the right-to-left message associated with the left-upper node or the left-lower node changed or a new conflict VPE based on the respective potential right-to-left tables, and updating each of the potential right-to-left tables based on the respective conflict PE or the respective new conflict VPE. Further, the BP decoding may be performed based on the respective one of the updated potential right-to-left tables.

In accordance with an exemplary embodiment, updating each of the potential right-to-left tables based on the respective conflict PE may comprise, in response to the right-to-left message associated with the conflict PE's left-upper node being changed, modifying, for the conflict PE and in the potential right-to-left table, the sign of the right-to-left message associated with its right-upper node based on the sign of the right-to-left message associated with its left-upper node and the sign of the right-to-left message associated with its right-lower node, to obtain a third potential right-to-left table, and modifying, for the conflict PE and in the potential right-to-left table, the sign of the right-to-left message associated with its right-lower node based on the sign of the right-to-left message associated with its left-upper node and the sign of the right-to-left message associated with its right-upper node, to obtain a fourth potential right-to-left table; in response to the right-to-left message associated with the conflict PE's left-lower node being changed, modifying, for the conflict PE and in the potential right-to-left table, the sign of the right-to-left message associated with its right-lower node to be same as the sign of the right-to-left message associated with its left-lower node, to obtain a fifth potential right-to-left table.

In accordance with an exemplary embodiment, updating the original right-to-left table based on the conflict VPE to obtain a plurality of potential right-to-left tables may comprise modifying, for the conflict VPE and in the original right-to-left table, the sign of the right-to-left message associated with its left-upper node to be positive and the sign of the right-to-left message associated with its right-upper node to be the same as the sign of the right-to-left message associated with its right-lower node, to obtain a first intermediate right-to-left table; modifying, for the conflict VPE and in the original right-to-left table, the sign of the right-to-left message associated with its left-upper node to be positive and the sign of the right-to-left message associated with its right-lower node to be the same as the sign of the right-to-left message associated with its right-upper node, to obtain a second intermediate right-to-left table; searching each of the first intermediate right-to-left table and the second intermediate right-to-left table for a conflict PE which is connected leftwards to the found conflict VPE and has the right-to-left message associated with the left-upper node or the left-lower node changed; for each of the first intermediate right-to-left table and the second intermediate right-to-left table, in response to the right-to-left message associated with the respective conflict PE's left-upper node being changed, modifying, for the respective conflict PE, the sign of the right-to-left message associated with its right-upper node based on the sign of the right-to-left message associated with its left-upper node and the sign of the right-to-left message associated with its right-lower node, to obtain a first potential right-to-left table, and modifying, for the respective conflict PE, the sign of the right-to-left message associated with its right-lower node based on the sign of the right-to-left message associated with its left-upper node and the sign of the right-to-left message associated with its right-upper node, to obtain a second potential right-to-left table; in response to the right-to-left message associated with the respective conflict PE's left-lower node being changed, modifying, for the respective conflict PE, the sign of the right-to-left message associated with its right-lower node to be same as the sign of the right-to-left message associated with its left-lower node, to obtain a third potential right-to-left table.

In accordance with an exemplary embodiment, the method may further comprise searching for, in response to no BP decoding based on the respective one of the potential right-to-left tables or the updated potential right-to-left tables being successful, a further conflict PE which is connected leftwards to the previously found conflict PE and has the right-to-left message associated with the left-upper node or the left-lower node changed or a new conflict VPE based on the respective one of the potential right-to-left tables or the updated potential right-to-left tables, and updating each of the potential right-to-left tables or the updated potential right-to-left tables based on the respective further conflict PE or the new conflict VPE. Further, the BP decoding may be performed based on the respective one of the newly updated potential right-to-left tables.

In accordance with an exemplary embodiment, the method may further comprise prior to searching the conflict PE or the new conflict VPE: determining whether an amount N of the potential right-to-left tables is greater than a predetermined number, calculating, in response to the amount of the potential right-to-left tables being greater than the predetermined number, a power metric for each BP decoding based on the respective potential right-to-left table, and retaining the predetermined number of potential right-to-left tables with the smaller power metric. Further, the searching of the conflict PE or the new conflict VPE may be performed on the retained potential right-to-left tables.

In accordance with an exemplary embodiment, the power metric for the BP decoding is calculated as follows:

$$PM(l) = \sum_{k\_frozen=1}^{N\_frozen} \ln\left(1 + e^{-llr_{k\_frozen}(l)}\right)$$

where PM(l) represents the power metric for the $l^{th}$ BP decoding, l is in a range from 1 to 2*N and comprising 1 and 2*N, N_frozen represents a total number of the most-left nodes indicating the frozen bit, $llr_{k\_frozen}(l)$ represents the right-to-left message associated with the k_frozen$^{th}$ most-left node which indicates the frozen bit in the form of logarithmic likelihood ratio, LLR in the last right-to-left table during the BP decoding, and ln(•) represents a logarithmic function with base e.

In accordance with an exemplary embodiment, the method may further comprise prior to obtaining the original right-to-left table, performing the BP decoding on the received information. Further, the obtaining of the original right-to-left table may be performed in response to the BP decoding being unsuccessful.

In accordance with an exemplary embodiment, the BP decoding may be determined as being unsuccessful if one of the followings is satisfied: a) iteration times of the BP decoding exceed maximum iteration times, and b) the current left-to-right table and the current right-to-left table are identical to the previous left-to-right table and the previous right-to-left table respectively.

In accordance with an exemplary embodiment, the left-to-right message and the right-to-left message may be in the form of logarithmic likelihood ratio, LLR.

In accordance with an exemplary embodiment, the left-to-right message in the original left-to-right table may be calculated as follows:

$$R_{i+1,j0}=f(R_{i,j2},R_{i,j3}),$$

$$R_{i+1,j1}=R_{i,j3},$$

$$f(a,b)=\text{sign}(a*b)*\min(|a|,|b|),$$

where $R_{i+1,j0}$ represents the left-to-right message associated with the right-upper node of the PE, $R_{i+1,j1}$ represents the left-to-right message associated with the right-lower node of the PE, $R_{i,j2}$ represents the left-to-right message associated with the left-upper node of the PE, and $R_{i,j3}$ represents the left-to-right message associated with the left-lower node of the PE, sign(•) represents a sign function, and min(•) represents a minimum function. Further, the left-to-right messages associated with the most-left nodes may be set based on bit positions of information bits and frozen bits in a source bit sequence from which the received information is originated. The left-to-right message associated with the most-left node indicating the information bit may be set to a first value and the left-to-right message associated with the most-left node indicating the frozen bit may be set to a second value.

In accordance with an exemplary embodiment, the right-to-left message in the original right-to-left table may be calculated as follows:

$$L_{i,j2}=f(R_{i,j3}+L_{i+1,j1},L_{i+1,j0}),$$

$$L_{i,j3}=f(R_{i,j2},L_{i+1,j0})+L_{i+1,j1},$$

$$f(a,b)=\text{sign}(a*b)*\min(|a|,|b|),$$

where $L_{i,j2}$ represents the right-to-left message associated with the left-upper node of the PE, $L_{i,j3}$ represents the right-to-left message associated with the left-lower node of the PE, $L_{i+1,j0}$ represents the right-to-left message associated with the right-upper node of the PE, and $L_{i+1,j1}$ represents the right-to-left message associated with the right-lower node of the PE, sign(•) represents a sign function, and min(•)

represents a minimum function. Further, the right-to-left messages associated with the most-right nodes may be set to the received information.

In accordance with an exemplary embodiment, searching for the conflict VPE may comprise checking, for each of the plurality PEs and based on the left-to-right table, the left-to-right messages associated with the left-upper node and the left-lower node, determining the PE of which the left-to-right message associated with its left-upper node has a larger value than the left-to-right message associated with its left-lower node as a verification processing element, checking, for the VPE and based on the right-ot-left table, whether the right-to-left message associated with the left-upper node has a negative sign, and determining, in response to the right-to-left message associated with the left-upper node having the negative sign, the VPE as the conflict VPE.

In accordance with an exemplary embodiment, the searching of the conflict VPE may be performed starting from the most-right PEs.

According to a second aspect of the present disclosure, there is provided a receiver. The receiver may comprise one or more processors and one or more memories comprising computer program codes. The one or more memories and the computer program codes may be configured to, with the one or more processors, cause the receiver at least to perform any step of the method according to the first aspect of the present disclosure.

According to a third aspect of the present disclosure, there is provided a receiver. The receiver may comprise a BP decoder configured to perform BP decoding, and a BP conflict search list circuitry configured to obtain, based on the received information and an original left-to-right table comprising left-to-right messages associated with nodes of a plurality of processing elements, PEs, for the BP decoding, an original right-to-left table comprising right-to-left messages associated with the nodes; search for, based on the original left-to-right table and the original right-to-left table, a conflict verification processing element, VPE, in the plurality of PEs, the conflict VPE being a VPE for which the left-to-right messages associated with the most-left nodes affecting the left-to-right message associated with its left-upper node indicate frozen bits and the left-to-right messages associated with the most-left nodes affecting the left-to-right message associated with its left-lower node indicate frozen bits and information bits, and having a negative sign for the right-to-left message associated with its left-upper node; and update the original right-to-left table based on the conflict VPE to obtain a plurality of potential right-to-left tables. The BP decoder is further configured to perform the BP decoding based on the respective one of the plurality of potential right-to-left tables.

According to a fourth aspect of the present disclosure, there is provided a computer-readable medium having computer program codes embodied thereon which, when executed on a computer, cause the computer to perform any step of the method according to the first aspect of the present disclosure.

BRIEF DESCRIPTION OF THE DRAWINGS

The disclosure itself, the preferable mode of use and further objectives are best understood by reference to the following detailed description of the embodiments when read in conjunction with the accompanying drawings, in which.

DETAILED DESCRIPTION

Figure 1:
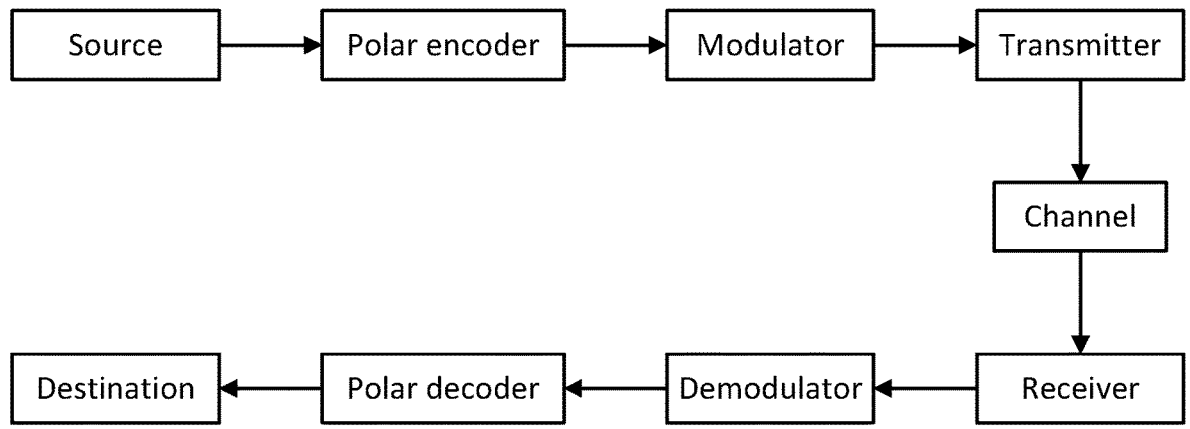
FIG. 1 is a simplified diagram of a communication system in which polar code is utilized.

The embodiments of the present disclosure are described in detail with reference to the accompanying drawings. It should be understood that these embodiments are discussed only for the purpose of enabling those skilled persons in the art to better understand and thus implement the present disclosure, rather than suggesting any limitations on the scope of the present disclosure. Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Furthermore, the described features, advantages, and characteristics of the disclosure may be combined in any suitable manner in one or more embodiments. One skilled in the relevant art will recognize that the disclosure may be practiced without one or more of the specific features or advantages of a particular embodiment. In other instances, additional features and advantages may be recognized in certain embodiments that may not be present in all embodiments of the disclosure.

As used herein, the term "communication network" refers to a network following any suitable communication standards, such as new radio (NR), long term evolution (LTE), LTE-Advanced, wideband code division multiple access (WCDMA), high-speed packet access (HSPA), and so on. Furthermore, the communications between a terminal device and a network node in the communication network may be performed according to any suitable generation communication protocols, including, but not limited to, the first generation (1G), the second generation (2G), 2.5G, 2.75G, the third generation (3G), 4G, 4.5G, 5G communication protocols, and/or any other protocols either currently known or to be developed in the future.

The term "network node" refers to a network device in a communication network via which a terminal device accesses to the network and receives services therefrom. The network node or network device may refer to a base station (BS), an access point (AP), a multi-cell/multicast coordination entity (MCE), a controller or any other suitable device in a wireless communication network. The BS may be, for example, a node B (NodeB or NB), an evolved NodeB (eNodeB or eNB), a next generation NodeB (gNodeB or gNB), an IAB node, a remote radio unit (RRU), a radio header (RH), a remote radio head (RRH), a relay, a low power node such as a femto, a pico, and so forth.

Yet further examples of the network node comprise multi-standard radio (MSR) radio equipment such as MSR BS s, network controllers such as radio network controllers (RNCs) or base station controllers (BSCs), base transceiver stations (BTSs), transmission points, transmission nodes, positioning nodes and/or the like. More generally, however, the network node may represent any suitable device (or group of devices) capable, configured, arranged, and/or operable to enable and/or provide a terminal device access to a wireless communication network or to provide some service to a terminal device that has accessed to the wireless communication network.

The term "terminal device" refers to any end device that can access a communication network and receive services therefrom. By way of example and not limitation, the terminal device may refer to a user equipment (UE), or other suitable devices. The UE may be, for example, a subscriber station, a portable subscriber station, a mobile station (MS) or an access terminal (AT). The terminal device may include, but not limited to, portable computers, image capture terminal devices such as digital cameras, gaming terminal devices, music storage and playback appliances, a mobile phone, a cellular phone, a smart phone, a tablet, a wearable device, a personal digital assistant (PDA), a vehicle, and the like.

As yet another specific example, in an Internet of things (IoT) scenario, a terminal device may also be called an IoT device and represent a machine or other device that performs monitoring, sensing and/or measurements etc., and transmits the results of such monitoring, sensing and/or measurements etc. to another terminal device and/or a network equipment. The terminal device may in this case be a machine-to-machine (M2M) device, which may in a 3rd generation partnership project (3GPP) context be referred to as a machine-type communication (MTC) device.

As one particular example, the terminal device may be a UE implementing the 3GPP narrow band Internet of things (NB-IoT) standard. Particular examples of such machines or devices are sensors, metering devices such as power meters, industrial machinery, or home or personal appliances, e.g. refrigerators, televisions, personal wearables such as watches etc. In other scenarios, a terminal device may represent a vehicle or other equipment, for example, a medical instrument that is capable of monitoring, sensing and/or reporting etc. on its operational status or other functions associated with its operation.

As used herein, the terms "first", "second" and so forth refer to different elements. The singular forms "a" and "an" are intended to include the plural forms as well, unless the context clearly indicates otherwise. The terms "comprises", "comprising", "has", "having", "includes" and/or "including" as used herein, specify the presence of stated features, elements, and/or components and the like, but do not preclude the presence or addition of one or more other features, elements, components and/or combinations thereof. The term "based on" is to be read as "based at least in part on". The term "one embodiment" and "an embodiment" are to be read as "at least one embodiment". The term "another embodiment" is to be read as "at least one other embodiment". Other definitions, explicit and implicit, may be included below.

As described above, the SC based decoding and the BP based decoding are main decoding schemes for polar code. The SCL decoding with Cyclic Redundancy Check (CRC) can performs better than the BP based decoding. However, the SCL decoding is to decode with serial characteristic and high complexity, which would lead to high decoding latency and reduced decoding throughput. On the other hand, the BP based decoding can be easily parallelized. Moreover, with enabled characteristic of soft-in/soft-out decoding, the BP based decoding could joint iterative detection and decoding. Therefore, the BP based decoding can satisfy requirements of low latency and high data rate. But the performance of the BP based decoding is not as good as that of the SCL decoding with CRC.

In addition, the performance of the BP based decoding may be improved with the increasing of predetermined maximum iteration times. However, for some sequences that are not able to be decoded by the BP based decoding, there are some updated iterations unnecessary that may cause higher computing consumption.

Therefore, it is desirable to provide an improved BP based decoding scheme to achieve better performance, low latency and easy parallel computing in a single decoder.

In accordance with some exemplary embodiments, the present disclosure provides improved solutions for the BP based decoding, i.e. BPCSL decoding. These solutions may be applied to a receiver in a communication network. The receiver may be implemented in a terminal device or a network node in the communication network. With the improved solutions, the receiver can implement easy parallel computing for decoding to reduce the decoding latency and improve the decoding performance, thereby reducing decoding complexity and computational power and increasing system capacity.

It is noted that some embodiments of the present disclosure are mainly described in relation to 5G specifications being used as non-limiting examples for certain exemplary network configurations and system deployments. As such, the description of exemplary embodiments given herein specifically refers to terminology which is directly related thereto. Such terminology is only used in the context of the presented non-limiting examples and embodiments, and does not limit the present disclosure naturally in any way. Rather, any other system configuration or radio technologies may equally be utilized as long as exemplary embodiments described herein are applicable.

FIG. 1 shows a communication system in which polar code is utilized. As shown in FIG. 1, a source may obtain K information bits from a higher layer and transfer them to a polar encoder. The polar encoder may add frozen bits into the information bits to generate an (N, K) polar code (which is an N-bit sequence) and send the polar code to a modulator. The modulator may select a digital or analog waveform with respect to the polar code and send the waveform to a transmitter. The transmitter may convert the waveform to a signal with a specific radio frequency and power and transmit the signal. After transmitted through a wireless channel, such as an additive white Gaussian noise (AWGN) channel, the signal is captured in a receiver. The receiver may convert the signal to the waveform with proper digitalization. Then a demodulator may extract the polar code from the waveform, and generate a hard or soft value. A polar decoder may retrieve the value from the demodulator and correct errors occurring in the transmission by a decoding scheme, then transfer the estimated information bits to a destination. In most cases, the destination may use cyclic redundancy check (CRC) to check the correctness of the information bits.

Figure 2:
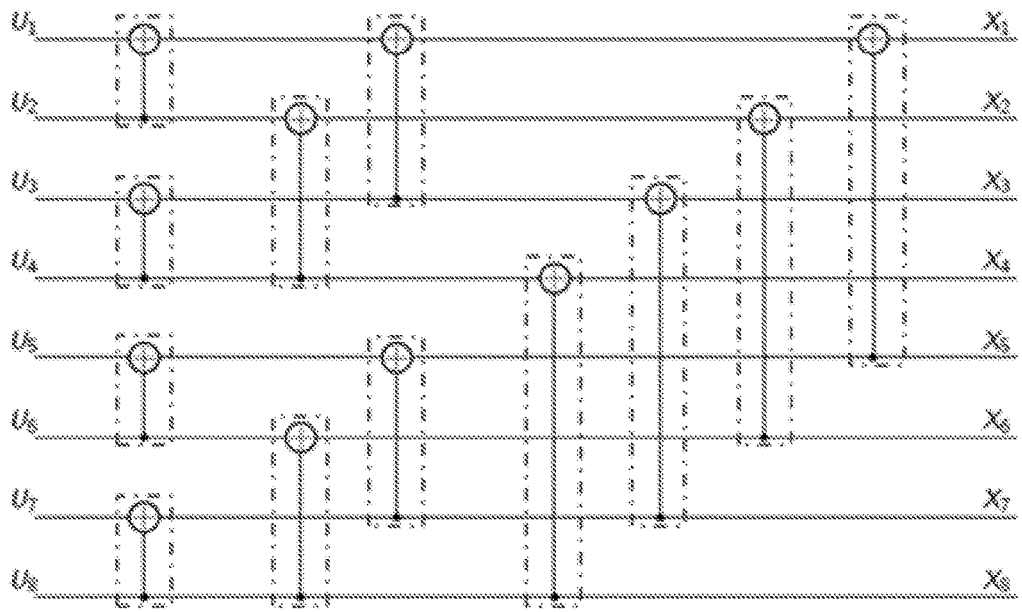
FIG. 2 is a diagram illustrating 8-bit polar code construction.

FIG. 2 shows an example graph of 8-bit polar code construction which may be implemented in the polar encoder in FIG. 1. Generally the N-bit polar code construction can be constituted by several $F_2$ kernels. The $F_2$ kernel is a mapping $F_2$: U→X such that $(u_1, u_2)→(u_1 \oplus u_2, u_2)$, where $\oplus$ represents an addition modulo-2 or XOR operation. With this construction, for an (N, K) polar code, K bits transfer more reliably and are used to transfer information bits, and (N−K) bits transfer less reliably and are used to transfer frozen bits. Bit positions of the information bits and frozen bits in a bit sequence can be expressed by a vector I as follows:

$$I_k = \begin{cases} 0 & \text{if } k \text{ is frozen bit} \\ 1 & \text{if } k \text{ is information bit} \end{cases}$$

where $1 \leq k \leq N$. In FIG. 2, N=8 and K=4, and the vector I=[0, 0, 0, 1, 0, 1, 1, 1] which indicates that the first to third bits and the fifth bit are frozen bits, and the remaining bits (i.e. the fourth bit and the sixth to eighth bits) are information bits. The generated (8, 4) polar code may be transmitted after modulation in a signal to a receiver. In the receiver, the demodulator may demodulate the received signal and provide the demodulated information to the polar decoder for decoding. As noise exists in the transmission, the received signal may also contain the noise.

Figure 3:
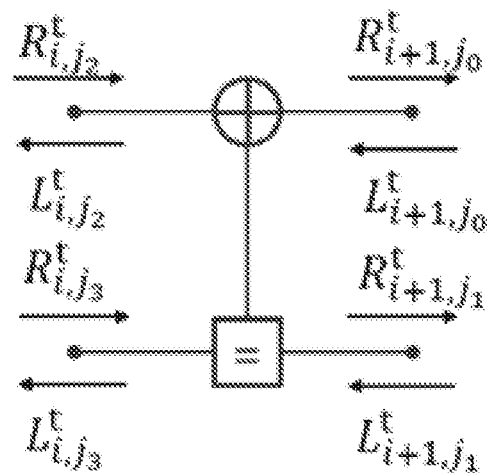
FIG. 3 is a diagram illustrating a processing element (PE) for the BP decoding.

To facilitate the understanding of the embodiments of the present disclosure, the conventional BP decoding will be first described in detail. The BP decoding may involve a plurality of processing elements (PEs). The PE is shown in FIG. 3. The BP decoding for an (N, K) polar code (where N=$2^m$) is based on an m-stage factor graph, which comprise N*(m+1) nodes. As shown in FIG. 3, the PE generally comprises four nodes, i.e. left-upper node (i, $j_2$), left-lower node (i, $j_3$), right-upper node (i+1, $j_0$), and right-lower node (i+1, $j_1$), where i represents a column in which the node is located in the factor graph. In FIG. 2, the PE is shown in a dashed block. Each node is associated with a left-to-right message denoted as R and a right-to-left message denoted as L. The left-to-right message and the right-to-left message may be in the form of logarithmic likelihood ratio (LLR). At t-th iteration, the left-to-right message R and the right-to-left message L can be calculated as follows:

$$R_{i+1,j_0}^t = f(R_{i,j_2}^t, R_{i,j_3}^t + L_{i+1,j_1}^{t-1}) \quad (1)$$

$$R_{i+1,j_1}^t = R_{i,j_3}^t + f(R_{i,j_2}^t, L_{i+1,j_0}^{t-1}) \quad (2)$$

$$L_{i,j_2}^t = f(R_{i,j_3}^t + L_{i+1,j_1}^t, L_{i+1,j_0}^t) \quad (3)$$

$$L_{i,j_3}^t = f(R_{i,j_2}^t, L_{i+1,j_0}^t) + L_{i+1,j_1}^t \quad (4)$$

$$f(a,b) = \text{sign}(a*b)*\min(|a|,|b|)$$

where $R_{i+1,j_0}$ and $L_{i+1,j_0}$ represent the left-to-right message and the right-to-left message associated with the right-upper node (i+1, $j_0$) respectively, $R_{i+1,j_1}$ and $L_{i+1,j_1}$ represent the left-to-right message and the right-to-left message associated with the right-lower node (i+1, $j_1$) respectively, $R_{i,j_2}$ and $L_{i,j_2}$ represent the left-to-right message and the right-to-left message associated with the left-upper node (i, $j_2$) respectively, $R_{i,j_3}$ and $L_{i,j_3}$ represent the left-to-right message and the right-to-left message associated with the left-lower node (i, $j_3$) respectively, sign(•) represents a sign function to get the sign of a parameter therein, and min(•) represents a minimum function. All the right-to-left messages L associated with the nodes in the factor graph form a right-to-left table (which is also referred to as L table) with size N*(m+1), and the left-to-right messages R associated with the nodes form a left-to-right table (which is also referred to as R table) with size N*(m+1).

In the BP decoding process, firstly an initialization of the R table and L table may be performed to obtain $R^0$ table and $L^0$ table. In $R^0$ table, the left-to-right messages associated with the most-left nodes may be set based on the bit positions of the information bits and frozen bits as indicated by the vector I. For the most-left node indicating the information bit, the associated left-to-right message may be set to a first value. For the most-left node indicating the frozen bit, the associated left-to-right message may be set to a second value. In an embodiment, the first value and the second value are the LLR values calculated based on the information bit and frozen bit. Other left-to-right messages in $R^0$ table will be set to all zero. With respect to the (8, 4) polar code in FIG. 2, $R^0$ table may be expressed as:

| inf. | 0 | 0 | 0 |
| inf. | 0 | 0 | 0 |
| inf. | 0 | 0 | 0 |
| 0    | 0 | 0 | 0 |
| inf. | 0 | 0 | 0 |
| 0    | 0 | 0 | 0 |

| 0 | 0 | 0 | 0 |
| 0 | 0 | 0 | 0 |

In $R^0$ table as above, the first value is calculated as 0 and the second value is calculated as infinite (denoted as inf.).

In $L^0$ table, the right-to-left messages associated with the most-right nodes may be set to the received information. As the right-to-left messages and the left-to-right messages use the LLR values, the received information needs to be transformed to the LLR values. Generally, the transformation of the received information is based on an LLR formula as follows:

$$L(x) = \log \frac{P(x=0|y)}{P(x=1|y)},$$

where y represents the received information, x represents a transferred bit, and L(x) represents the LLR value. Other right-to-left messages in $L^0$ table may be set to all zero. For example, with respect to the (8, 4) polar code in FIG. 2, $L^0$ table may be expressed as:

| 0 | 0 | 0 | 0 | $L(x_1)$ |
| 0 | 0 | 0 | 0 | $L(x_2)$ |
| 0 | 0 | 0 | 0 | $L(x_3)$ |
| 0 | 0 | 0 | 0 | $L(x_4)$ |
| 0 | 0 | 0 | 0 | $L(x_5)$ |
| 0 | 0 | 0 | 0 | $L(x_6)$ |
| 0 | 0 | 0 | 0 | $L(x_7)$ |
| 0 | 0 | 0 | 0 | $L(x_8)$ |

Then R table and L table may be updated. In each iteration, R table may be calculated from the most-left nodes to the most-right nodes based on the above equations (1) and (2). Each time when calculating the R table, the left-to-right messages associated with the most-left nodes keep unchanged. Then L table may be calculated from the most-right nodes to the most-left nodes based on the above equations (3) and (4). Each time when calculating the L table, the right-to-left messages associated with the most-right nodes keep unchanged.

In the first iteration to calculate $R^1$ table, as all the right-to-left messages except the right-to-left messages associated with the most-right nodes are 0 in $L^0$ table, the above equations (1) and (2) could be simplified as:

$$R_{i+1,j_0}^1 = f(R_{i,j_2}^1, R_{i,j_3}^1 + L_{i+1,j_1}^0) = f(R_{i,j_2}^1, R_{i,j_3}^1)$$

$$R_{i+1,j_1}^1 = R_{i,j_3}^1 + f(R_{i,j_2}^1, L_{i+1,j_0}^0) = R_{i,j_3}^1$$

Figure 4:
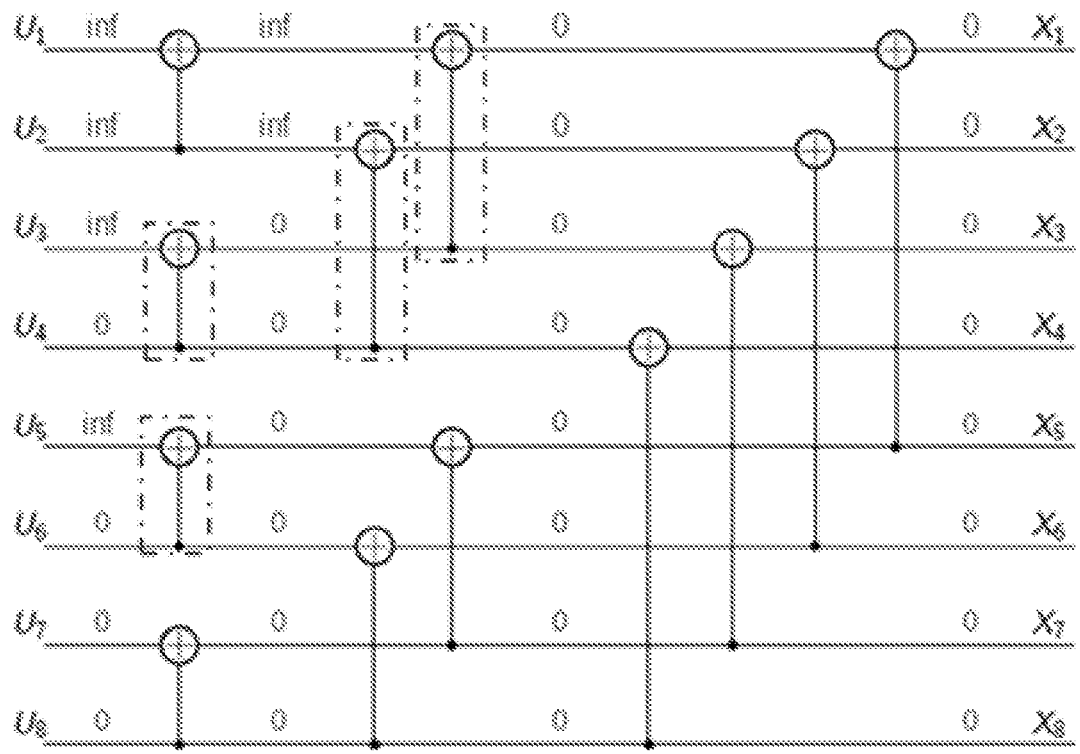
FIG. 4 is a diagram illustrating an example left-to-right table of the 8-bit polar code shown in FIG. 2.

FIG. 4 shows a diagram illustrating $R^1$ table for the (8, 4) polar code in FIG. 2.

At the end of each iteration, the right-to-left messages associated with the most-left nodes in L table may decide the decoded information bits û. The decoded information bits û may be decided as:

$$\hat{u}_k = \begin{cases} 0 & L_{1k} \geq 0 \\ 1 & L_{1k} < 0 \end{cases}, \text{ where } I_k = 1$$

If the decoded information bits û pass the CRC, the BP decoding will be considered as being successful, and the decoded information bits û are provided to the destination. If the decoded information bits û do not pass the CRC and the iteration times do not exceed the predetermined maximum iteration times, the BP decoding process continues the next iteration of calculating the R table and L table. If the decoded information bits û do not pass the CRC and the iteration times exceed the maximum iteration times, or if the current R and L tables are identical to the previous R and L tables respectively and no decoded information bits û pass the CRC, the BP decoding will be considered as being unsuccessful.

Figure 5:
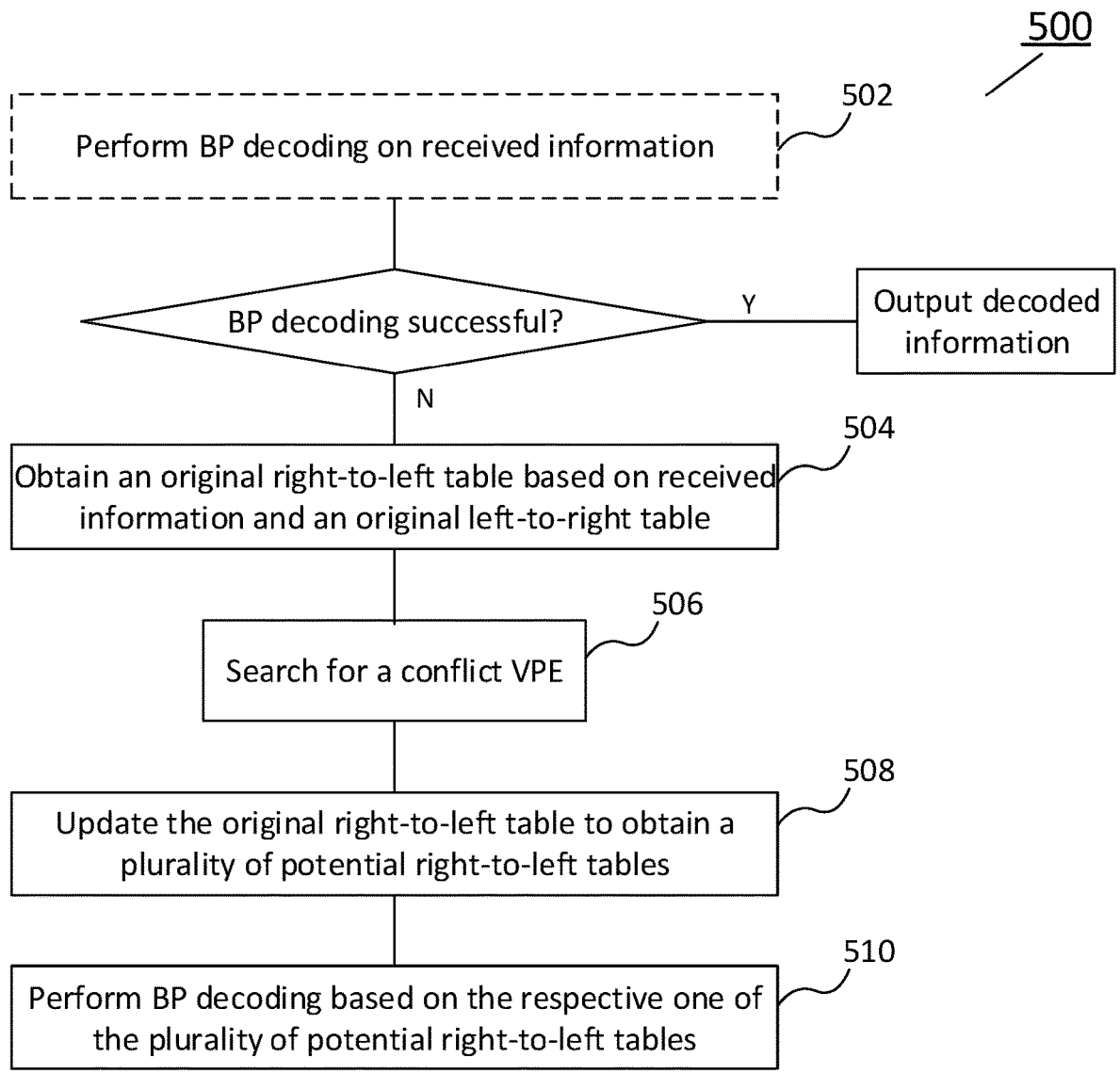
FIG. 5 is a flowchart illustrating a method for BPCSL decoding performed by a receiver according to some embodiments of the present disclosure.

FIG. 5 is a flowchart illustrating a method 500 for BPCSL decoding according to some embodiments of the present disclosure. The method 500 illustrated in FIG. 5 may be performed by an apparatus implemented in or communicatively coupled to a receiver. In some embodiments, the receiver may be implemented in a terminal device or a network node. In accordance with an exemplary embodiment, the terminal device may be a UE, and the network node may be a gNB.

According to the exemplary method 500 illustrated in FIG. 5, the receiver obtains an original right-to-left table based on received information and an original left-to-right table, as shown in block 504. In some embodiments, the original left-to-right table corresponds to $R^1$ table, and the original right-to-left table corresponds to $L^1$ table. As described above, $L^1$ table may be obtained based on the above equations (3) and (4). In $L^1$ table, the right-to-left messages associated with the most-right nodes are set to the received information in the form of LLR. In some embodiments, the received information is the information obtained after demodulating a received signal for the decoding. As the received signal may contain the noise, the received information may contain a polar code and the noise. Moreover, the bit positions of the information bits and frozen bits in the polar code can be known.

In some embodiments, prior to obtaining the original right-to-left table (block 504), the receiver may firstly perform the BP decoding as described above on the received information, as shown in block 502. If the BP decoding is unsuccessful, the receiver performs the obtaining of the original right-to-left table.

Then, in block 506, the receiver searches for a conflict verification processing element (VPE) in the plurality of PEs, based on the original left-to-right table $R^1$ and the original right-to-left table $L^1$. In some embodiments, the conflict VPE is a kind of PE which satisfies certain conditions.

Firstly, the conflict VPE shall be a VPE. With reference to $R^1$ table as shown in FIG. 4, there are three possible situations for the left-to-right messages $R_{i,j_2}^1$, $R_{i,j_3}^1$ associated with the left-upper node (i, $j_2$) and the left-lower node (i, $j_3$) of the PE respectively, i.e. [inf. inf.], [inf. 0], and [0, 0]. Correspondingly, the left-to-right messages $R_{i+1,j_0}^1$ and $R_{i+1,j_1}^1$ associated with the right-upper node (i+1, $j_0$) and the right-lower node (i+1, $j_1$) respectively may be [inf. inf.], [0 0], and [0 0]. Table 1 shows the possible situations for the left-to-right messages $R_{i,j_2}^1$ and $R_{i,j_3}^1$.

TABLE 1

| [$R_{i,j_2}^1$ $R_{i,j_3}^1$] | [$R_{i+1,j_0}^1$ $R_{i+1,j_1}^1$] | Characteristics |
|---|---|---|
| [inf. inf.] | [inf. inf.] | The information of bits at the nodes (i, $j_2$), (i, $j_3$), (i + 1, $j_0$) and (i + 1, $j_1$) are all known, and $L_{i,j_2}^1$, $L_{i,j_3}^1$, $L_{i+1,j_0}^1$ and $L_{i+1,j_1}^1$ are all have positive signs. |
| [inf. 0] | [0 0] | The information of bit at the node (i, $j_2$) is known but the information of bits at the node (i, $j_3$), (i + 1, $j_0$) and (i + 1, $j_1$) are unknown. In this situation, the signs of $L_{i,j_3}^1$, $L_{i+1,j_0}^1$ and $L_{i+1,j_1}^1$ are not certain, which may cause the sign of $L_{i,j_2}^1$ to be negative. But the sign of $L_{i,j_2}^1$ should be positive essentially. |
| [0 0] | [0 0] | The information of bits at the nodes (i, $j_2$), (i, $j_3$), (i + 1, $j_0$) and (i + 1, $j_1$) are all unknown, and the signs of $L_{i,j_2}^1$, $L_{i,j_3}^1$, $L_{i+1,j_0}^1$ and $L_{i+1,j_1}^1$ are not certain. |

In Table 1, in the situation that [$R_{i,j_2}^1$ $R_{i,j_3}^1$] is [inf. 0], the sign of the right-to-left message $L_{i,j_2}^1$ should be positive and the signs of the right-to-left messages $L_{i+1,j_0}^1$ and $L_{i+1,j_1}^1$ should be the same. Such information may be used to verify whether the PE is correct. Therefore, the PE with the left-to-right messages [$R_{i,j_2}^1$ $R_{i,j_3}^1$ $R_{i+1,j_0}^1$ $R_{i+1,j_1}^1$] as [inf. 0 0 0] is defined as the VPE.

In some embodiments, the VPE may satisfy that, in $R^1$ table, the left-to-right messages associated with the most-left nodes affecting the left-to-right message $R_{i,j_2}^1$ associated with the VPE's left-upper node (i, $j_2$) indicate frozen bits and the left-to-right messages associated with the most-left nodes affecting the left-to-right message $R_{i,j_3}^1$ associated with the VPE's left-lower node (i, $j_3$) indicate frozen bits and information bits. That is, if the most-left nodes for which the left-to-right messages are used for the calculation of the left-to-right message associated with the left-upper node of the PE indicate the frozen bits only, and if the most-left nodes for which the left-to-right messages are used for the calculation of the left-to-right message associated with the left-lower node of the PE indicate both the frozen bits and the information bits, such the PE will be considered as the VPE.

Further, the conflict VPE may have a negative sign for the right-to-left message $L_{i,j_2}^1$ associated with its left-upper node (i, $j_2$) in $L^1$ table. In the VPE, the right-to-left messages $L_{i,j_2}^1$ and $L_{i,j_3}^1$ may be calculated as:

$$L_{i,j_2}^1 = f(R_{i,j_3}^1 + L_{i+1,j_1}^1, L_{i+1,j_0}^1) = f(L_{i+1,j_0}^1, L_{i+1,j_1}^1)$$

$$L_{i,j_3}^1 = f(R_{i,j_2}^1, L_{i+1,j_0}^1) + L_{i+1,j_1}^1 = L_{i+1,j_0}^1 + L_{i+1,j_1}^1$$

Therefore, if the signs of the right-to-left messages $L_{i+1,j_0}^1$ and $L_{i+1,j_1}^1$ are opposite, the sign of the right-to-left messages $L_{i,j_2}^1$ is to be negative. Therefore, the VPE with the negative $L_{i,j_2}^1$ is defined as the conflict VPE.

In some embodiments, in the searching of the conflict VPE, the receiver may check the left-to-right messages $R_{i,j_2}^1$ and $R_{i,j_3}^1$ associated with the left-upper node (i, $j_2$) and the left-lower node (i, $j_3$) of each PE, based on $R^1$ table. If a PE satisfies that the left-to-right message $R_{i,j_2}^1$ has a larger value than the left-to-right message $R_{i,j_3}^1$, this PE may be determined as the VPE. Then for the VPE, the receiver may check whether the right-to-left message $L_{i,j_2}^1$ associated with the left-upper node (i, $j_2$) has a negative sign based on $L^1$ table. If the right-to-left message $L_{i,j_2}^1$ has the negative sign, the VPE may be determined as the conflict VPE. If the right-to-left message $L_{i,j_2}^1$ has the positive sign, it indicates that the VPE is not the conflict VPE, and the receiver may continue to check the next VPE until find the conflict VPE. In some embodiments, the searching of the conflict VPE may be performed from the most-right PEs.

Figure 6A:
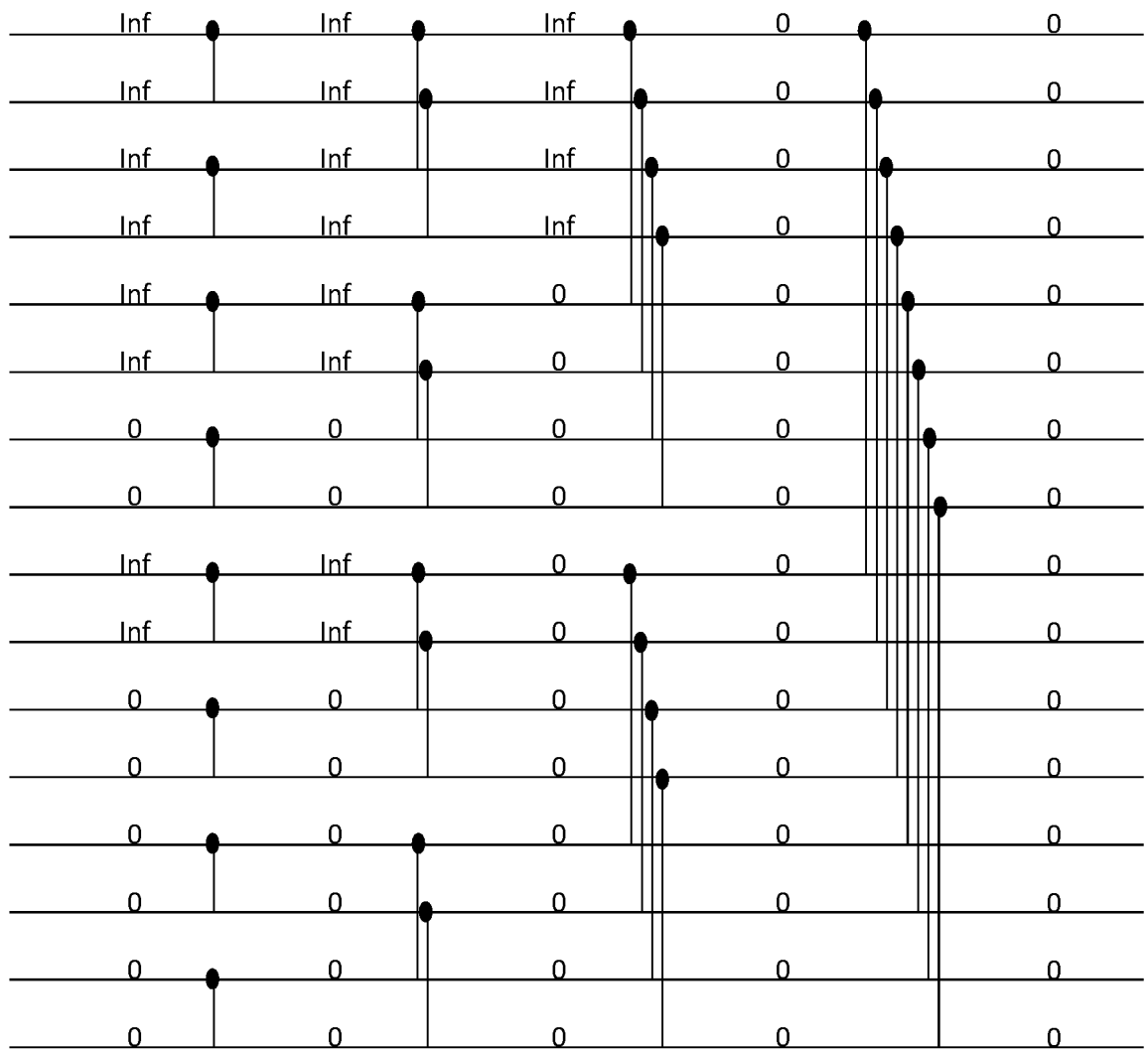
FIGS. 6A and 6B are diagrams illustrating an example of the original left-to-right table and the original right-to-left table of a (16, 8) polar code according to some embodiments of the present disclosure.
Figure 6B:
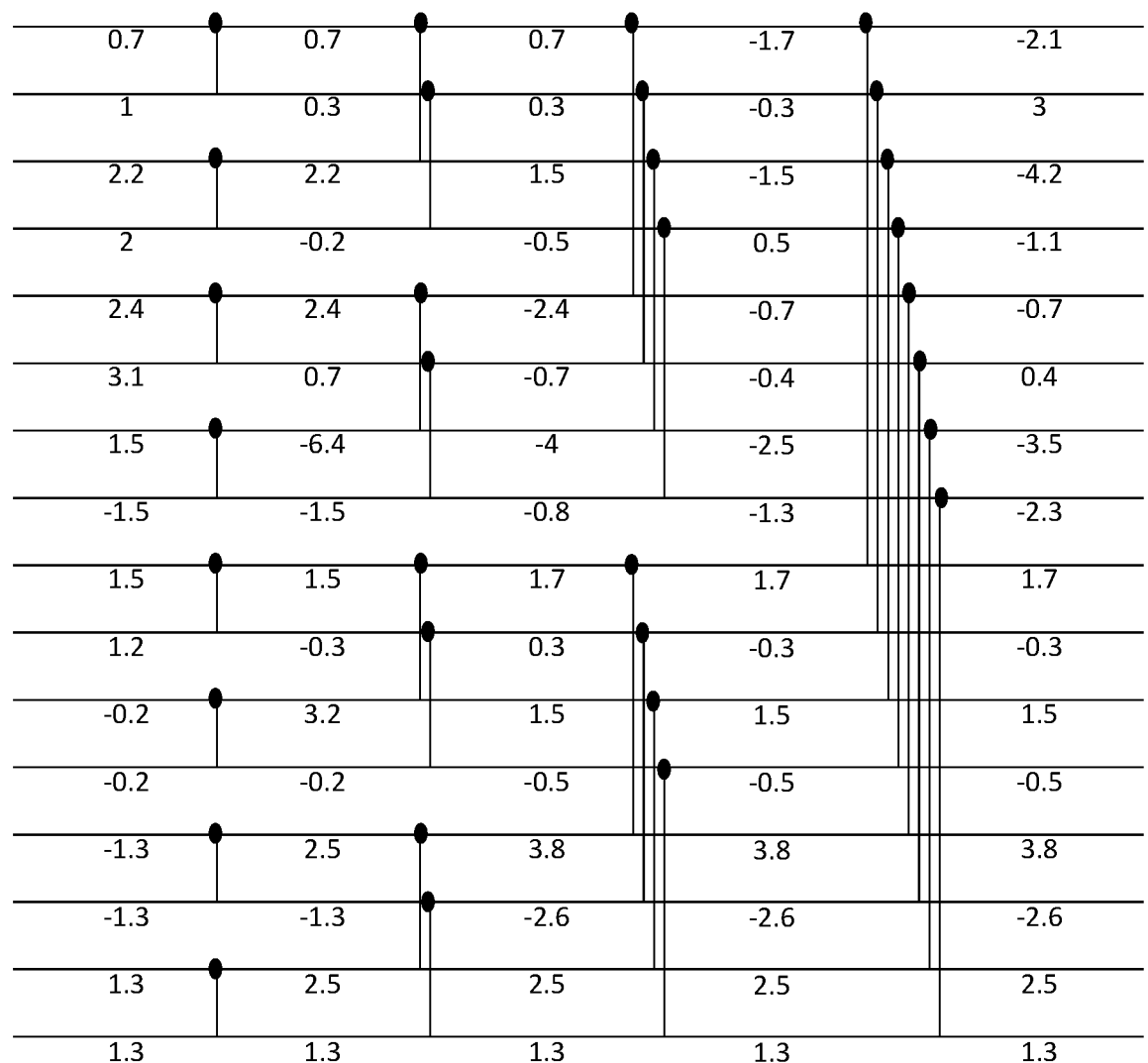

FIGS. 6A and 6B illustrate an example of the obtained $R^1$ table and $L^1$ table of a (16, 8) polar code, respectively. In the example, assume that the vector I of the (16, 8) polar code is [0, 0, 0, 0, 0, 0, 1, 1, 0, 0, 1, 1, 1, 1, 1, 1]. Based on the $R^1$ table with size of 16*5 in FIG. 6A, from the most-right PEs, it can be found that the left-to-right message associated with node (3, 4) has a larger value than the left-to-right message associated with node (3, 8), then the PE having nodes (3, 4), (3, 8), (4, 4) and (4, 8) is determined as a VPE. Then based on the $L^1$ table with size of 16*5 as shown in FIG. 6B, it can be found that the right-to-left message associated with the node (3, 4) of the VPE has a negative sign, and thus this VPE is determined as a conflict VPE.

Returning to FIG. 5, after the conflict VPE is found, in block 508, the receiver updates the original right-to-left table $L^1$ based on the conflict VPE to obtain a plurality of potential right-to-left tables. As described above, in the conflict VPE, the signs of the right-to-left messages $L_{i+1,j_0}^1$ and $L_{i+1,j_1}^1$ are opposite to each other, which is not correct. Thus the right-to-left messages of the conflict VPE need to be updated to be correct. That is, the sign of the right-to-left message $L_{i,j_2}^1$ should be modified to be positive, and the signs of the right to left messages $L_{i+1,j_0}^1$ and $L_{i+1,j_1}^1$ should be modified to be same, i.e. both positive or both negative. Therefore, there are two ways to update the conflict VPE. One way is to modify the sign of the right-to-left message $L_{i,j_2}^1$ to be positive and modify the sign of the right-to-left message $L_{i+1,j_0}^1$ to be same as the sign of the right-to-left message $L_{i+1,j_1}^1$. The other way is to modify the sign of the right-to-left message $L_{i,j_2}^1$ to be positive and modify the sign of the right-to-left message $L_{i+1,j_1}^1$ to be same as the sign of the right-to-left message $L_{i+1,j_0}^1$.

Therefore, in the updating of the $L^1$ table, the receiver may modify the sign of the right-to-left message $L_{i,j_2}^1$ to be positive and modify the sign of the right-to-left message $L_{i+1,j_0}^1$ to be same as the sign of the right-to-left message $L_{i+1,j_1}^1$ in the $L^1$ table, thereby obtaining a first potential right-to-left table. Further, the receiver may also modify the sign of the right-to-left message $L_{i,j_2}^1$ to be positive and modify the sign of the right-to-left message $L_{i+1,j_1}^1$ to be same as the sign of the right-to-left message $L_{i+1,j_0}^1$ in the $L^1$ table, thereby obtaining a second potential right-to-left table. Herein the potential right-to-left table can be regarded as $L^1$ table after updating.

Figure 7A:
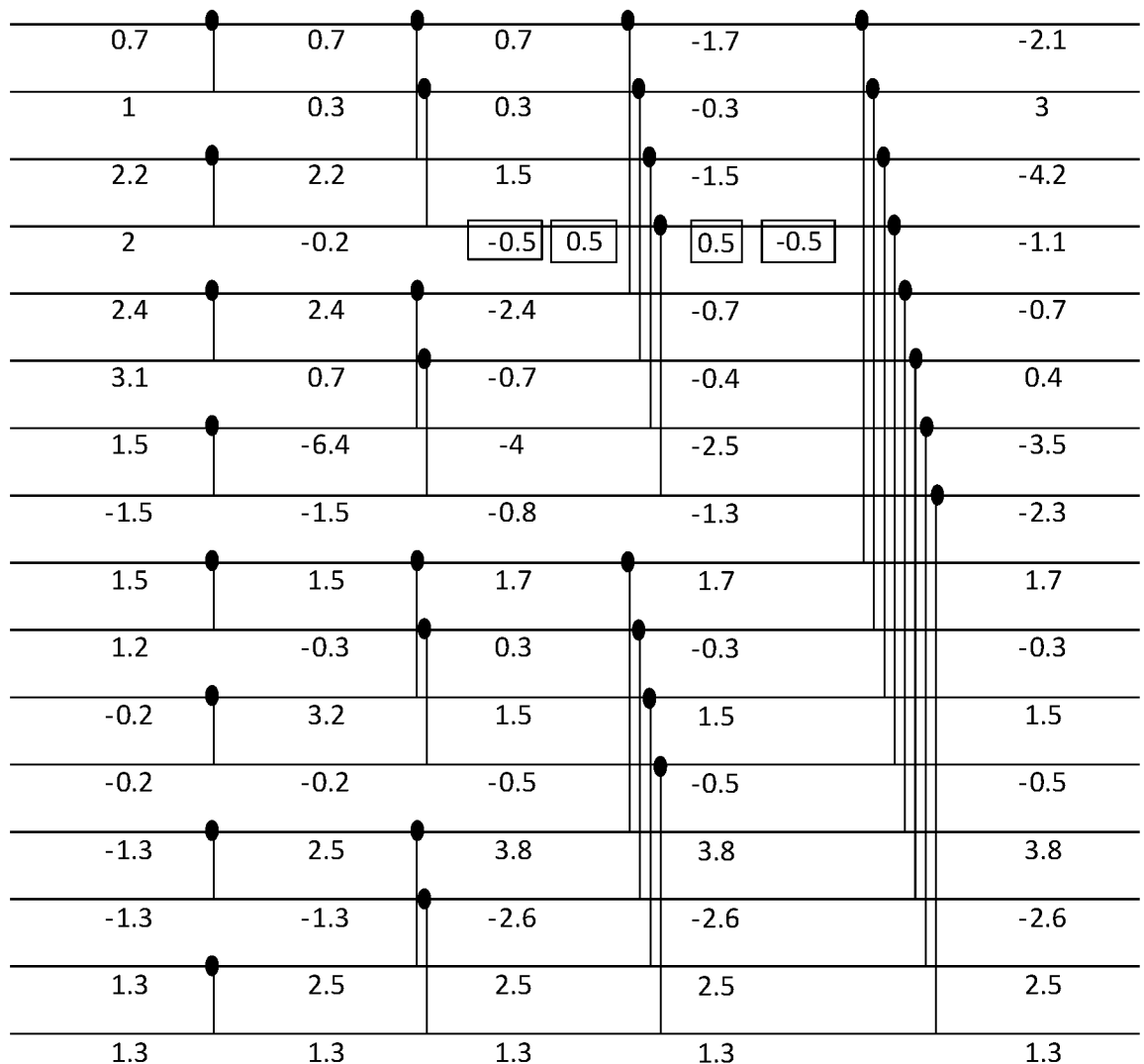
FIGS. 7A and 7B are diagrams illustrating an example of the potential right-to-left table based on the original right-to-left table in FIG. 6B.
Figure 7B:
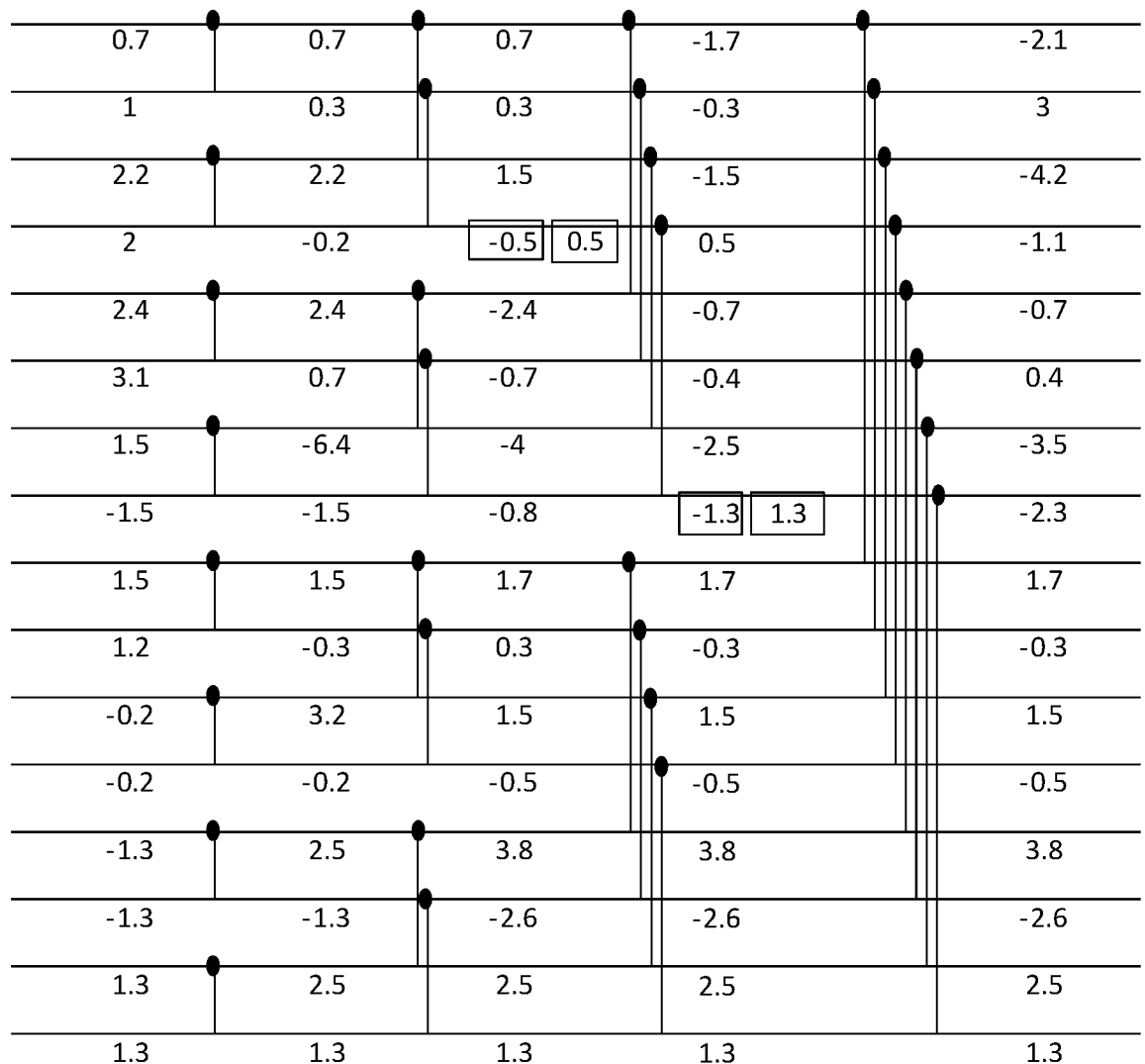

With respect to the above example as shown in FIG. 6B, the receiver updates the conflict VPE having nodes (3, 4), (3, 8), (4, 4) and (4, 8) in two ways as described above, to obtain two potential right-to-left tables, as shown in FIGS. 7A and 7B respectively. In FIG. 7A, the right-to-message associated with node (3,4) is modified from −0.5 to 0.5, and the right-to-left message associated with node (4, 4) is modified from 0.5 to −0.5, and thus the signs of the right-to-left messages associated with node (4, 4) and node (4, 8) are both negative. In FIG. 7B, the right-to-message associated with node (3,4) is modified from −0.5 to 0.5, and the right-to-left message associated with node (4, 8) is modified from −1.3 to 1.3, and thus the signs of the right-to-left messages associated with node (4, 4) and node (4, 8) are both positive.

Then in block 510, the receiver performs the BP decoding based on the respective one of the plurality of potential right-to-left tables. When performing the BP decoding, the receiver may utilize each potential right-to-left table as $L^1$ table to calculate $R^2$ table, and then calculate $L^2$ table. Then the decoded information bits $\hat{u}$ may be decided from $L^2$ table. If the decoded information bits $\hat{u}$ pass the CRC, it indicates that the BP decoding is successful. If the decoded information bits $\hat{u}$ do not pass the CRC and iteration times do not exceed the maximum iteration time, the receiver may continue to perform the BP decoding. If the decoded information bits $\hat{u}$ do not pass the CRC and the iteration times exceed the maximum iteration time, or if the current L table is same as the previous L table and no decoded information bits $\hat{u}$ pass the CRC, the BP decoding will be considered as being unsuccessful.

Figure 8:
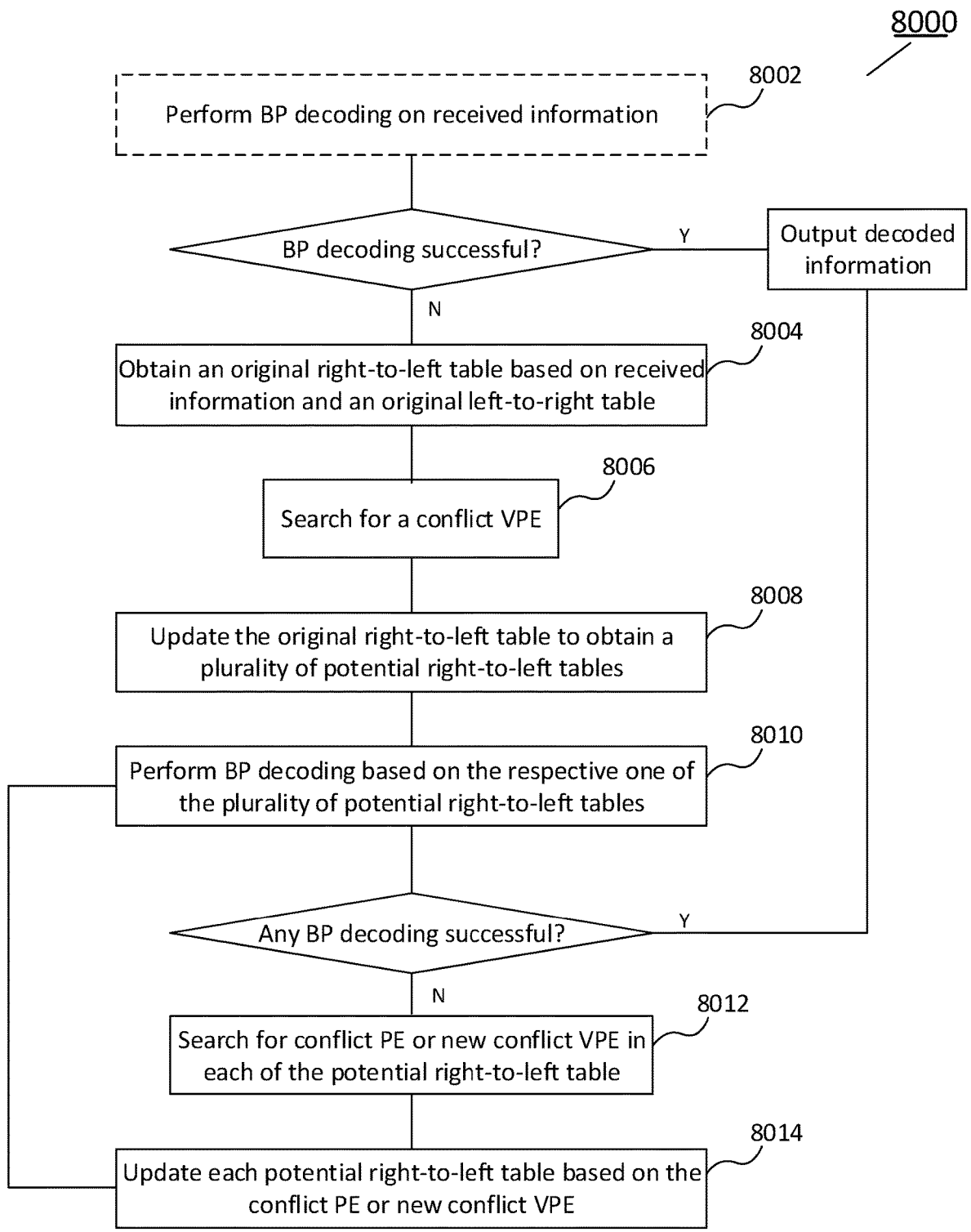
FIG. 8 is a flowchart illustrating the method for BPCSL decoding according to some embodiments of the present disclosure.

FIG. 8 shows a flowchart of the method 8000 for BPCSL decoding performed by the receiver according to some embodiments of the present disclosure. In the method 8000, the blocks 8002, 8004, 8006, 8008 and 8010 are same as the blocks 502, 504, 506, 508 and 510.

According to the exemplary method 8000 illustrated in FIG. 8, if no BP decoding based on the respective potential right-to-left tables is successful at block 8010, the receiver searches each of the potential right-to-left table for a conflict PE or a new conflict VPE, as shown in block 8012. As the sign of the right-to-left message $L_{i+1,j_0}^1$ or $L_{i+1,j_1}^1$ of the conflict VPE is modified, it would affect the right-to-left messages for the PE(s) which is connected at the right of the conflict VPE, that is, the sign of the right-to-left message $L_{i,j_2}^1$ or $L_{i,j_3}^1$ of such the PE is changed. Herein the conflict PE is defined as a PE which is connected leftwards to the conflict VPE and has the right-to-left message associated with the left-upper node or the left-lower node changed. In some embodiments, the new conflict VPE may be searched for only when no conflict PE is found.

Then in block 8014, the receiver updates each potential right-to-left table based on the respective conflict PE or the new conflict VPE. In some embodiments, in the updating of the potential right-to-left table based on the conflict PE, the receiver may check whether the right-to-left message associated with the conflict PE's left-upper node or the right-to-left message associated with the conflict PE's left-lower node is changed. If the right-to-left message associated with the conflict PE's left-upper node is changed, the receiver may modify the sign of the right-to-left message associated with the right-upper node in the potential right-to-left table, based on the sign of the right-to-left message associated with the left-upper node and the sign of the right-to-left message associated with the right-lower node, to obtain the updated potential right-to-left table. In some embodiments, if the sign of the right-to-left message associated with the left-upper node is negative, the sign of the right-to-left message associated with the right-upper node will be modified to be opposite to the sign of the right-to-left message associated with the right-lower node. If the sign of the right-to-left message associated with the left-upper node is positive, the sign of the right-to-left message associated with the right-upper node will be modified to be same as the sign of the right-to-left message associated with the right-lower node. On the other hand, the receiver may modify the sign of the right-to-left message associated with the right-lower node in the potential right-to-left table, based on the sign of the right-to-left message associated with the left-upper node and the sign of the right-to-left message associated with the right-upper node, to obtain another updated right-to-left table. If the right-to-left message associated with the conflict PE's left-lower node is changed, the receiver may modify the sign of the right-to-left message associated with the right-lower node to be same as the sign of the right-to-left message associated with the left-lower node in the potential right-to-left table. Therefore, for each potential right-to-left table, one or two updated potential right-to-left table can be obtained after the updating.

Figure 9A:
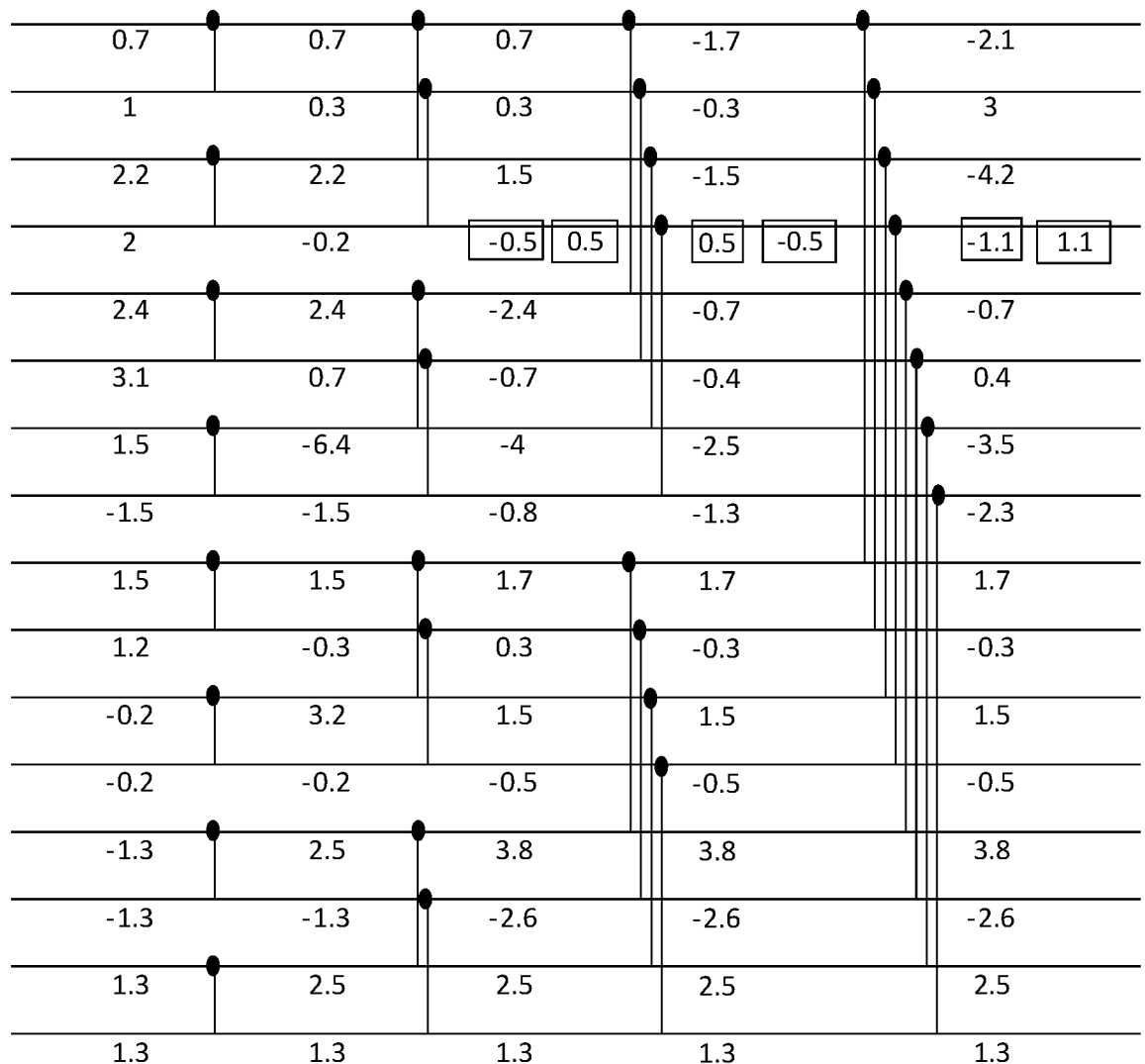
FIGS. 9A and 9B are diagrams illustrating an example of the potential right-to-left table obtained by updating the potential right-to-left table in FIG. 7A.
Figure 9B:
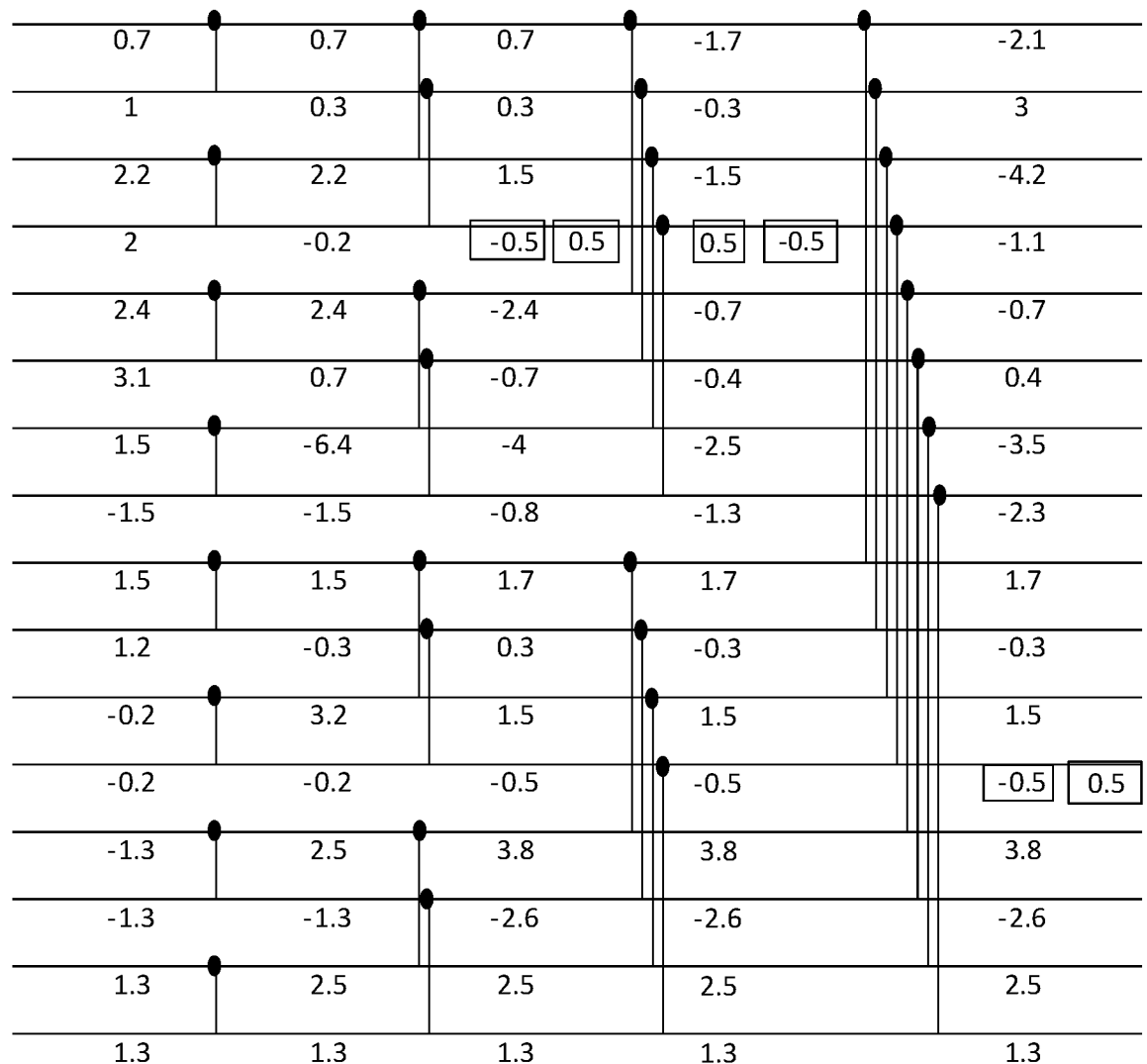

Referring to the potential right-to-left table as shown in FIG. 7A, the PE having nodes (4, 4), (4, 12), (5, 4) and (5, 12) is searched for as the conflict PE, and the sign of the right-to-left message associated with node (4, 4) (which is the left-upper node of the conflict PE) is changed. Then the right-to-left message associated with node (5, 4) can be modified to obtain one updated potential right-to-left table as shown in FIG. 9A. Also, the right-to-left message associated with node (5, 12) can be modified to obtain another updated potential right-to-left table as shown in FIG. 9B. In FIG. 9A, since the sign of the right-to-left message associated with node (4, 4) is negative and the sign of the right-to-left message associated with node (5, 12) is negative, the right-to-left message associated with node (5, 4) is modified from −1.1 to 1.1. In FIG. 9B, since the sign of the right-to-left message associated with node (4, 4) is negative and the sign of the right-to-left message associated with node (5, 4) is negative, the right-to-left message associated with node (5, 12) is modified from −0.5 to 0.5.

Figure 10A:
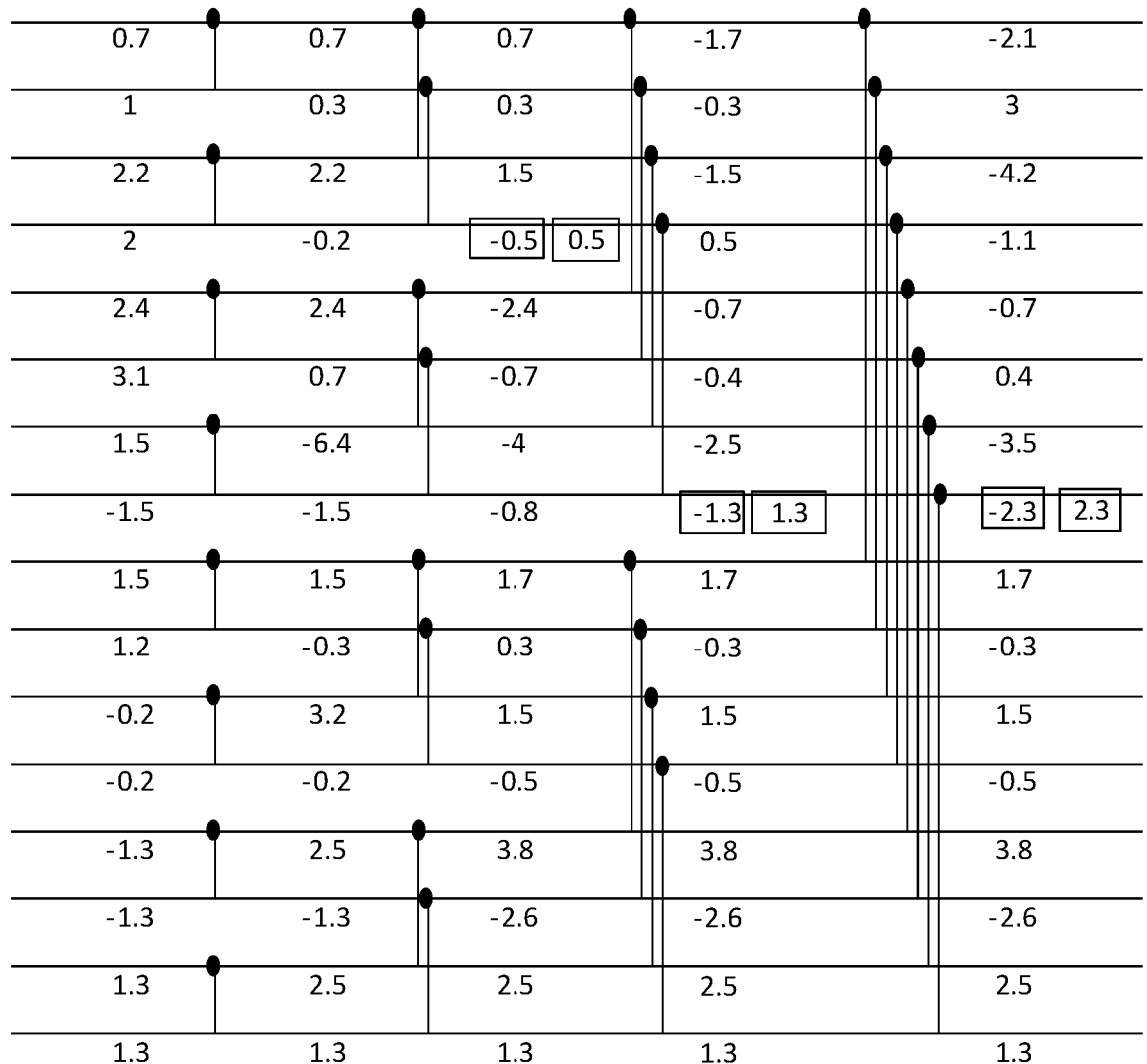
FIGS. 10A and 10B are diagrams illustrating an example of the potential right-to-left table obtained by updating the potential right-to-left table in FIG. 7B.
Figure 10B:
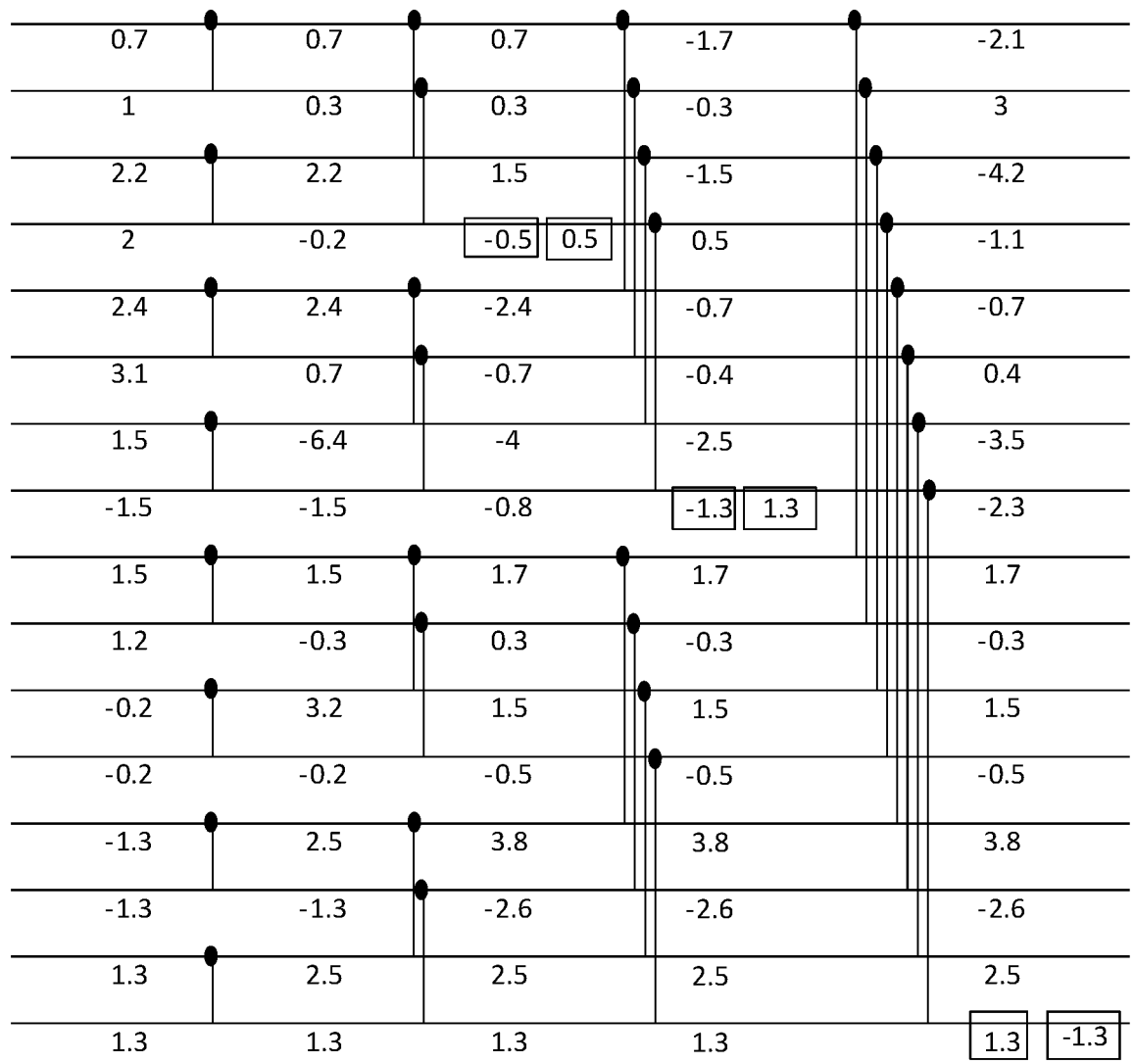

Referring to the potential right-to-left table as shown in FIG. 7B, the PE having nodes (4, 8), (4, 16), (5, 8) and (5, 16) is searched for as the conflict PE, and the sign of the right-to-left message associated with node (4, 8) (which is the left-upper node of the conflict PE) is changed. Then the right-to-left message associated with node (5, 8) can be modified to obtain one updated potential right-to-left table as shown in FIG. 10A. Also, the right-to-left message associated with node (5, 16) can be modified to obtain another updated potential right-to-left table as shown in FIG. 10B. In FIG. 10A, since the sign of the right-to-left message associated with node (4, 8) is positive and the sign of the right-to-left message associated with node (5, 16) is positive, the right-to-left message associated with node (5, 8) is modified from −2.3 to 2.3. In FIG. 10B, since the sign of the right-to-left message associated with node (4, 8) is positive and the sign of the right-to-left message associated with node (5, 8) is negative, the right-to-left message associated with node (5, 16) is modified from 1.3 to −1.3.

After updating each potential right-to-left table in block 8014, the method proceeds to block 8010, in which the receiver may perform the BP decoding based on the respective updated potential right-to-left tables. In the BP decoding, the receiver may utilize each updated potential right-to-left table as $L^1$ table to perform the BP decoding. If the BP decoding based on any updated potential right-to-left table is successful, the BPCSL decoding ends. If no BP decoding based on the respective updated potential right-to-left table is successful, the method proceeds to block 8012 in which the receiver searches each of the updated potential right-to-left table for a further conflict PE or a new conflict VPE. In some embodiments, the further conflict PE may be connected left-towards to the previously found conflict PE and has the right-to-left message associated with the left-upper node or the left-lower node changed. After the further conflict PE or the new conflict VPE is found, the receiver may repeat the operations in block 8014 and 8010.

Figure 11A:
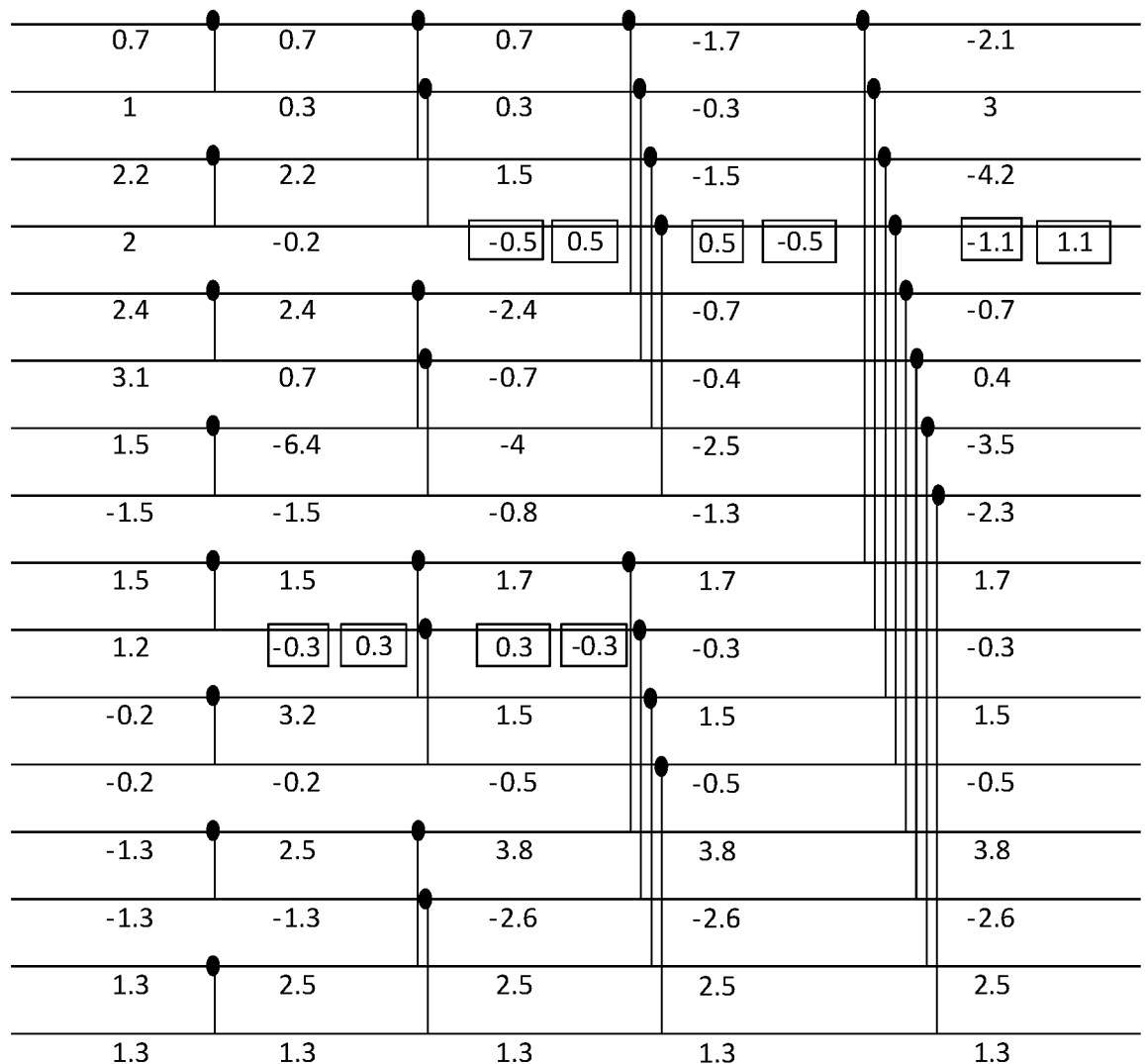
FIGS. 11A and 11B are diagrams illustrating an example of the potential right-to-left table obtained by updating the potential right-to-left table in FIG. 9A.
Figure 11B:
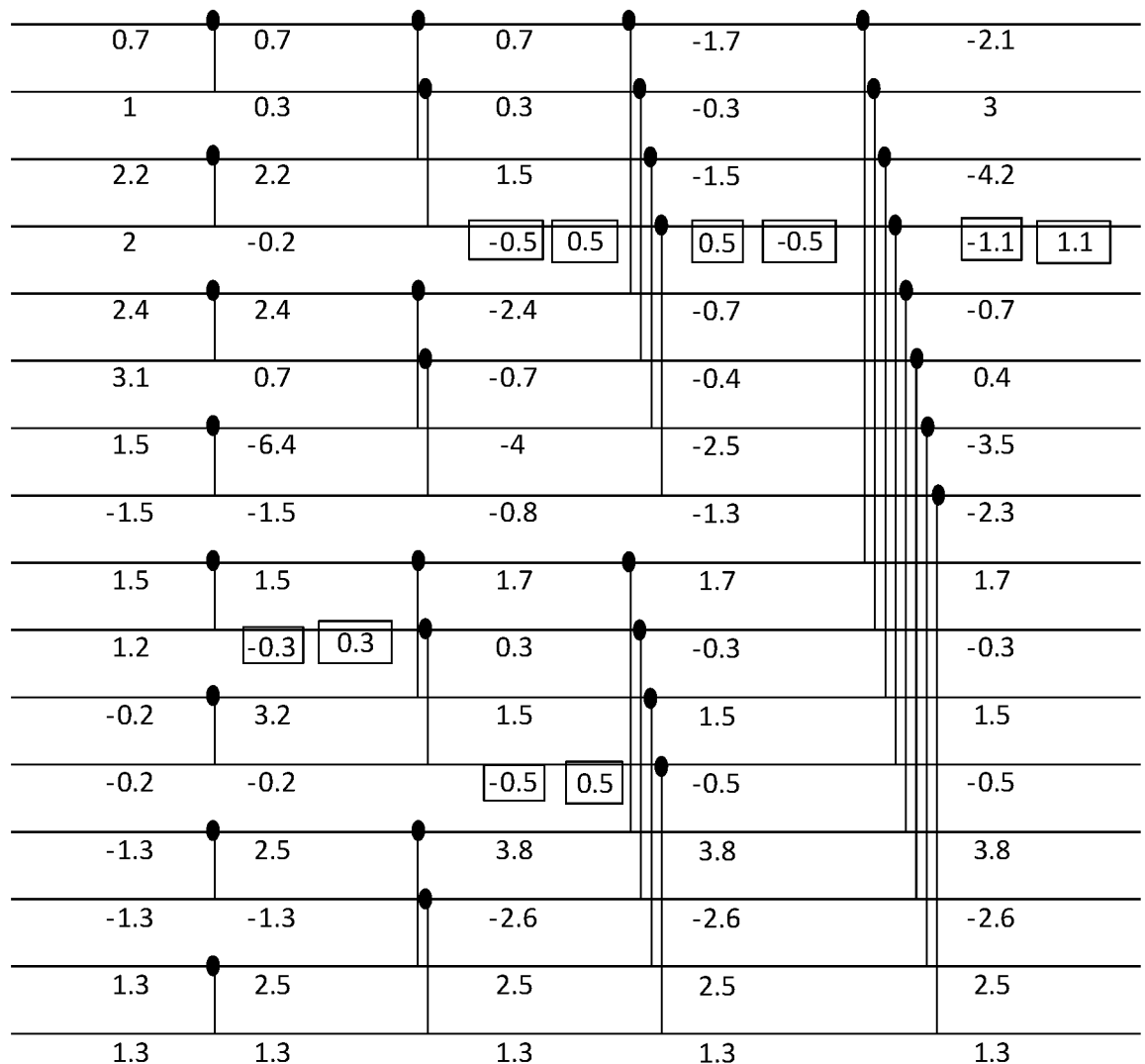

For example, if the BP decoding based on each of the updated potential right-to-left tables as shown in FIGS. 9A, 9B, 10A and 10B is not successful, the receiver may search for the new conflict PE or conflict VPE in these potential right-to-left tables. Take FIG. 9A as an example, as no more conflict PE is found, the receiver may search for another conflict VPE. According to $R^1$ table as shown in FIG. 6A and the potential right-to-left table as shown in FIG. 9A, another conflict VPE can be found, which has nodes (2, 10), (2, 12), (3, 10) and (3, 12). Then the right-to-left messages for the conflict VPE can be modified to obtain new potential right-to-left tables as shown in FIGS. 11A and 11B respectively. In FIG. 11A, the right-to-left message associated with node (2, 10) is modified from −0.3 to 0.3, and the right-to-left message associated with node (3, 10) is modified from 0.3 to −0.3. In FIG. 11B, the right-to-left message associated with node (2, 10) is modified from −0.3 to 0.3, and the right-to-left message associated with node (3, 12) is modified from −0.5 to 0.5. Then the receiver may utilize each of the potential right-to-left tables as shown in FIGS. 11A and 11B as $L^1$ table to perform the BP decoding.

According to the above described embodiments, with the updating of the right-to-left table, an amount of the potential right-to-left table will significantly increase, and it will take more and more time to perform the BP decoding based on each potential right-to-left table. In order to improve the decoding efficiency, a maximum number for the potential right-to-left tables is predetermined. In some embodiments, if no BP decoding based on the respective potential right-to-left table is successful, prior to searching for the conflict PE or new conflict VPE in these potential right-to-left tables, the receiver may determine an amount N of these potential right-to-left tables which were used for the BP decoding, and further determine whether the amount N is greater than the predetermined maximum number. If not, the receiver may perform the subsequent searching of the conflict PE or conflict VPE on all the potential right-to-left tables. If the amount is greater than the predetermined maximum amount, the receiver may calculate a power metric for each BP decoding which was performed based on the respective potential right-to-left table. The power metric may be used to evaluate the performance of the BP decoding. The smaller the power metric is, the better the performance of the BP decoding is. In some embodiments, the power metric may be calculated based on the last right-to-left table during the BP decoding. For example, the power metric may be calculated as:

$$PM(l) = \sum_{k\_frozen=1}^{N\_frozen} \ln\left(1 + e^{-llr_{k\_frozen}(l)}\right) \quad (1)$$

where PM(l) represents the power metric for the $l^{th}$ BP decoding, l is in a range from 1 to 2*N and comprising 1 and 2*N, N_frozen represents a total number of the most-left nodes indicating the frozen bit, $llr_{k\_frozen}(l)$ represents the right-to-left message associated with the k_frozen$^{th}$ most-left node which indicates the frozen bit in the form of logarithmic likelihood ratio, LLR, in the last right-to-left table during the BP decoding, and ln(•) represents a logarithmic function with base e. After calculating the power metric for each BP decoding, the predetermined maximum number of the potential right-to-left tables corresponding to the smaller power metrics may be retained for the subsequent searching.

Figure 12:
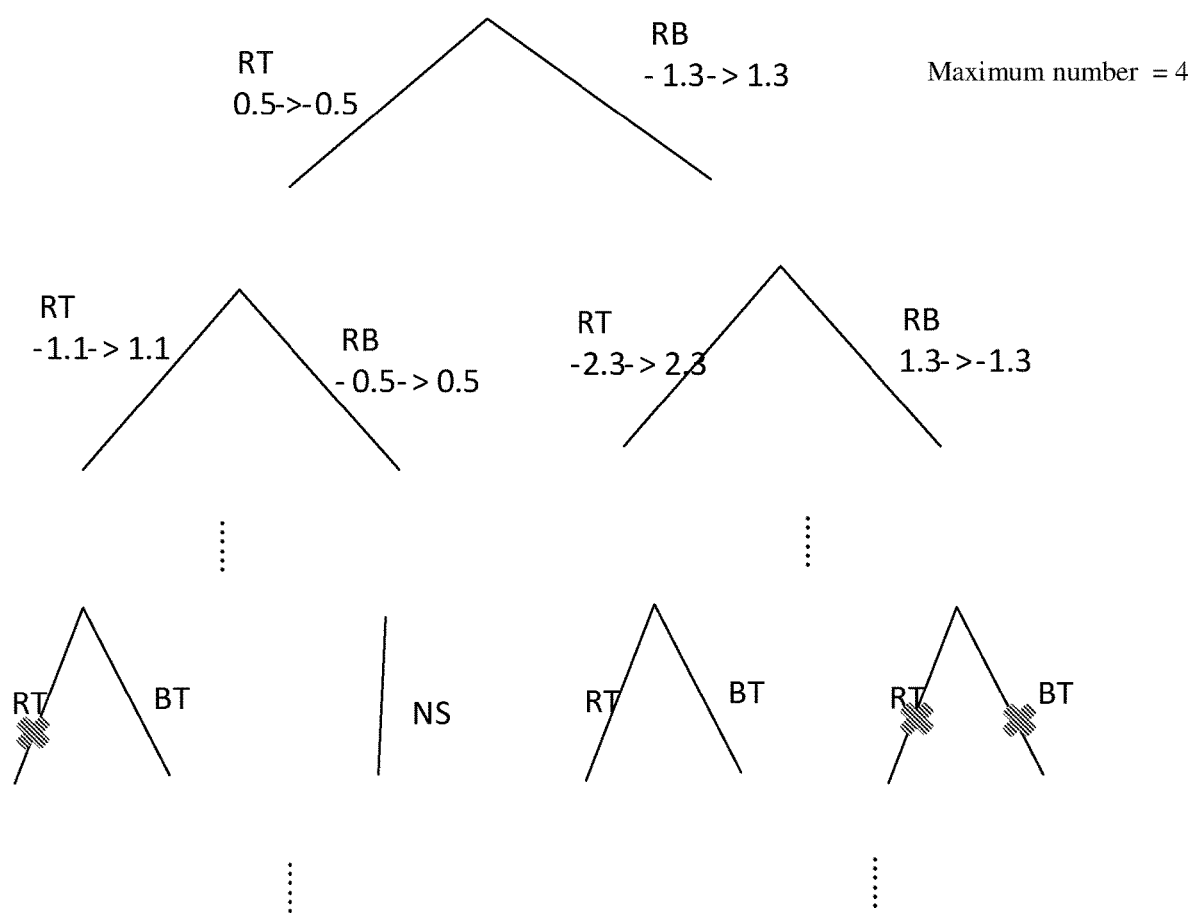
FIG. 12 is a diagram illustrating an example searching tree which reflects the updating of the potential right-to-left table from FIG. 6B to FIGS. 7A and 7B, and from FIGS. 7A and 7B to FIGS. 9A, 9B, 10A and 10B respectively.

In order to illustrate the updating of the right-to-left table or the potential right-to-left table(s) more intuitively, a searching tree may be used. FIG. 12 shows an example searching tree which reflects the updating of the potential right-to-left table from FIG. 6B to FIGS. 7A and 7B, and from FIGS. 7A and 7B to FIGS. 9A, 9B, 10A and 10B respectively, in which the maximum number is preset to 4. In FIG. 12, the root node at the first level of the searching tree may represent a conflict VPE, such as the conflict VPE having nodes (3, 4), (3, 8), (4, 4) and (4, 8). As there are two ways to update the conflict VPE, there are two branches extended from the root node to leaf nodes at the second level. The leaf node may represent a conflict PE or another conflict VPE, such as the conflict PE having nodes (4, 4), (4, 12), (5, 4) and (5, 12) in FIG. 7A and the conflict PE having nodes (4, 8), (4, 16), (5, 8) and (5, 16) in FIG. 7B. RT represents the case where the right-to-left message associated with the right-upper node is updated, RB represents the case where the right-to-left message associated with the right-lower node is updated. As the right-to-left messages associated with the left-upper nodes of the two conflict PEs are changed, there are also two ways to update the conflict PEs. Therefore, there are two branches extended from each leaf node at the second level, which corresponds to FIGS. 9A, 9B, 10A and 10B. If the right-to-left message associated with the left-lower node of the conflict PE is changed, there is only one way to update and such a case will be represented by NS in the search tree. NS also represents the case where no new conflict VPE is found. In the searching tree, a path from the root node to any leaf-node can reflect an updating process of the potential right-to-left table, and thus there is the power metric of the BP decoding for each path. If there are 7 paths terminated at a certain level, that is, the amount of the potential right-to-left tables for performing the BP decoding is 7 which exceeds the maximum number, the power metric can be calculated for each BP decoding based on the respective one of the 7 potential right-to-left tables. Only 4 paths with the smaller power metric can be retained for the subsequent updating, and other 3 paths with higher power metric would be removed.

In the above described embodiments, it is described that the potential right-to-left table is obtained by updating the conflict VPE only for the original right-to-left table. In some other embodiments, the potential right-to-left table may be obtained by updating the conflict VPE and the conflict PE which is connected leftwards to the conflict VPE for the original right-to-left table. In such the embodiments, after the conflict VPE is found, the receiver may modify the sign of the right-to-left message associated with the conflict VPE's left-upper node to be positive and the sign of the right-to-left message associated with its right-upper node to be the same as the sign of the right-to-left message associated with its right-lower node in the original right-to-left table, to obtain a first intermediate right-to-left table. On the other hand, the receiver may the sign of the right-to-left message associated with the conflict VPE's left-upper node to be positive and the sign of the right-to-left message associated with its right-lower node to be the same as the sign of the right-to-left message associated with its right-upper node in the original right-to-left table, to obtain a second intermediate right-to-left table. Then the receiver may search each of the first intermediate right-to-left table and the second intermediate right-to-left table for the conflict PE. After the conflict PE is found for each of the first and second intermediate right-to-left table, the receiver may check whether the right-to-left message associated with the left-upper node or the left-lower node of the conflict PE is changed. If the right-to-left message associated with the left-upper node is changed, the receiver may modify the sign of the right-to-left message associated with its right-upper node based on the sign of the right-to-left message associated with its left-upper node and the sign of the right-to-left message associated with its right-lower node in the respective intermediate right-to-left table, to obtain the respective potential right-to-left tables. Moreover, the receiver may modify the sign of the right-to-left message associated with its right-lower node based on the sign of the right-to-left message associated with its left-upper node and the sign of the right-to-left message associated with its right-upper node in each of the first and second intermediate right-to-left table, to obtain further respective potential right-to-left tables. If the right-to-left message associated with the left-lower node is changed, the receiver may modify the sign of the right-to-left message associated with its right-lower node to be same as the sign of the right-to-left message associated with its left-lower node in the respective intermediate right-to-left table, to obtain the potential right-to-left tables.

It can be seen from the above embodiments of the present disclosure, with the BPCSL decoding, the decoding performance can be improved as all the possible updating ways for the right-to-left table are considered. Moreover, the BPCSL decoding can realize parallel hardware implementation easily to reduce the decoding latency.

Please note that the order for performing the steps as shown in FIGS. 5 and 8 is illustrated only as an example. In some implementation, some steps may be performed in a reverse order or in parallel. In some other implementation, some steps may be omitted or combined.

The various blocks shown in FIGS. 5 and 8 may be viewed as method steps, and/or as operations that result from operation of computer program code, and/or as a plurality of coupled logic circuit elements constructed to carry out the associated function(s). The schematic flow chart diagrams described above are generally set forth as logical flow chart diagrams. As such, the depicted order and labeled steps are indicative of specific embodiments of the presented methods. Other steps and methods may be conceived that are equivalent in function, logic, or effect to one or more steps, or portions thereof, of the illustrated methods. Additionally, the order in which a particular method occurs may or may not strictly adhere to the order of the corresponding steps shown.

Figure 13:
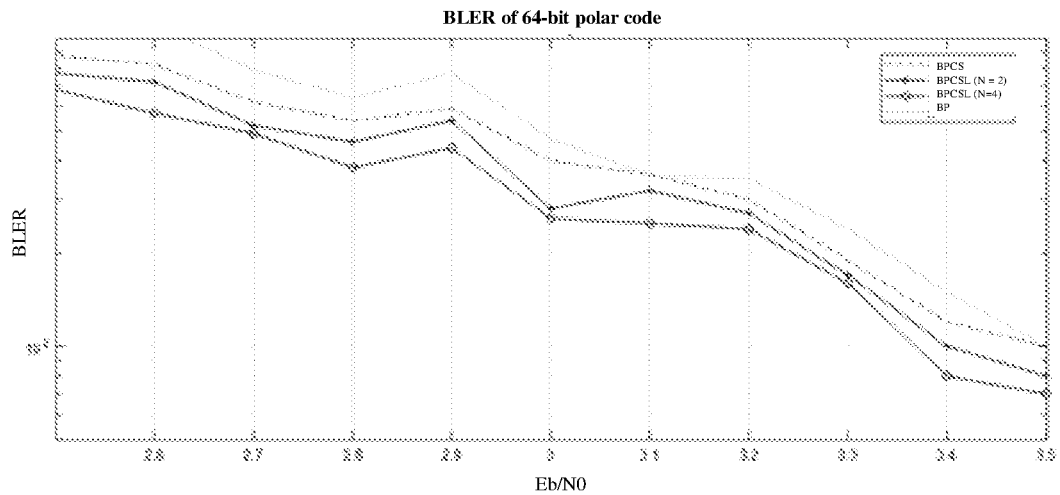
FIG. 13 is a diagram illustrating simulation results of block error rate (BLER) for decoding 64-bit sequence.
Figure 14:
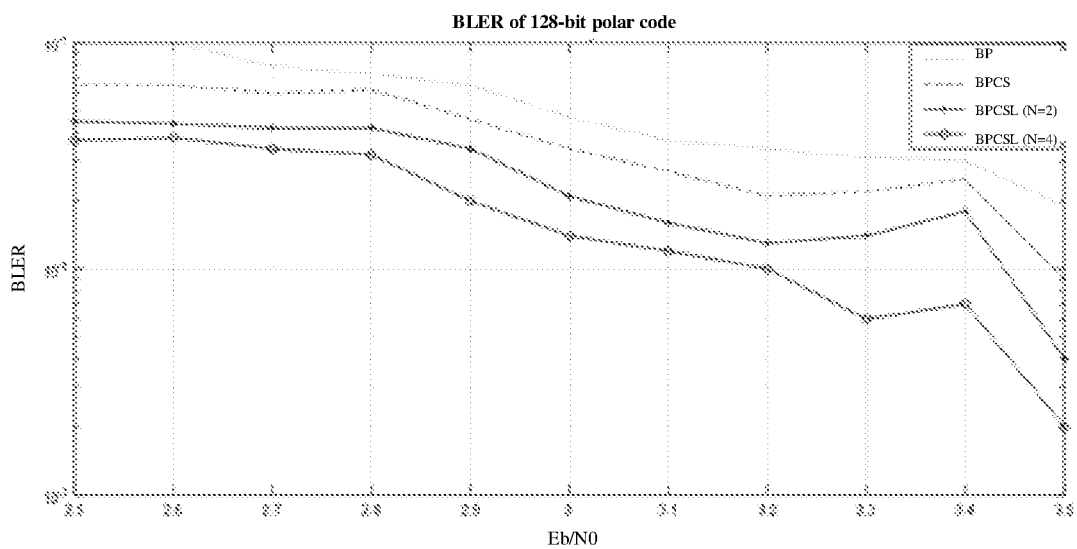
FIG. 14 is a diagram illustrating simulation results of BLER for decoding 128-bit sequence.

FIGS. 13 and 14 illustrate simulation results of block error rate (BLER) for decoding 64 bit sequence and 128 bit sequence, respectively, using the conventional BP decoding (denoted as "BP") and the BPCSL decoding (denoted as "BPCSL", with N=2, 4) according to the embodiments of the present disclosure. It can be seen that, with respect to BLER, the BPCSL decoding performs much better than the conventional BP decoding. Moreover, with the larger N, the performance of the BPCSL decoding is better.

Figure 15:
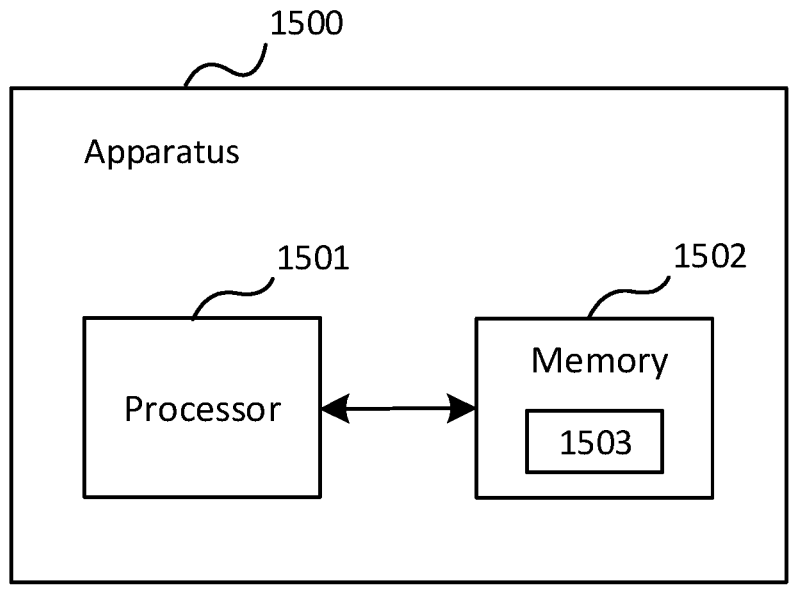
FIG. 15 is a block diagram illustrating an apparatus according to some embodiments of the present disclosure.

FIG. 15 is a block diagram illustrating an apparatus 1500 according to various embodiments of the present disclosure. As shown in FIG. 15, the apparatus 1500 may comprise one or more processors such as processor 1501 and one or more memories such as memory 1502 storing computer program codes 1503. The memory 1502 may be non-transitory machine/processor/computer readable storage medium. In accordance with some exemplary embodiments, the apparatus 1500 may be implemented as an integrated circuit chip or module that can be plugged or installed into the receiver as described with respect to FIGS. 5 and 8.

In some implementations, the one or more memories 1502 and the computer program codes 603 may be configured to, with the one or more processors 1501, cause the apparatus 1500 at least to perform any operation of the method as described in connection with FIGS. 5 and 8. In such embodiments, the apparatus 1500 may be implemented as at least part of or communicatively coupled to the receiver as described above. As a particular example, the apparatus 1500 may be implemented as a receiver.

Alternatively or additionally, the one or more memories 1502 and the computer program codes 1503 may be configured to, with the one or more processors 1501, cause the apparatus 1500 at least to perform more or less operations to implement the proposed methods according to the exemplary embodiments of the present disclosure.

Figure 16:
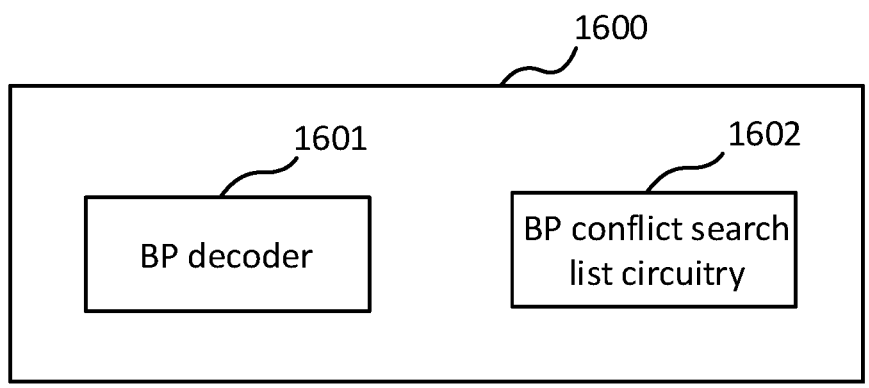
FIG. 16 is a block diagram illustrating an apparatus according to some embodiments of the present disclosure.

FIG. 16 is a block diagram illustrating an apparatus 1600 according to some embodiments of the present disclosure. As shown in FIG. 16, the apparatus 1600 may comprise a BP decoder 1601 and a BP conflict search list circuitry 1602. In an exemplary embodiment, the apparatus 1600 may be implemented in a receiver. The receiver may be implemented in a terminal device such as UE or a network node such as gNB. The BP decoder 1601 may be configured to carry out the operations in blocks 502 and 510 or the operations in blocks 8002 and 8010. The BP conflict search list circuitry 1602 may be configured to carry out the operations in blocks 504, 506 and 508 or the operations in blocks 8004, 8006, 8008, 8012 and 8014. Optionally, the BP decoder 1601 and/or the BP conflict search list circuitry 1602 may be configured to carry out more or less operations to implement the proposed methods according to the exemplary embodiments of the present disclosure.

Figure 17:
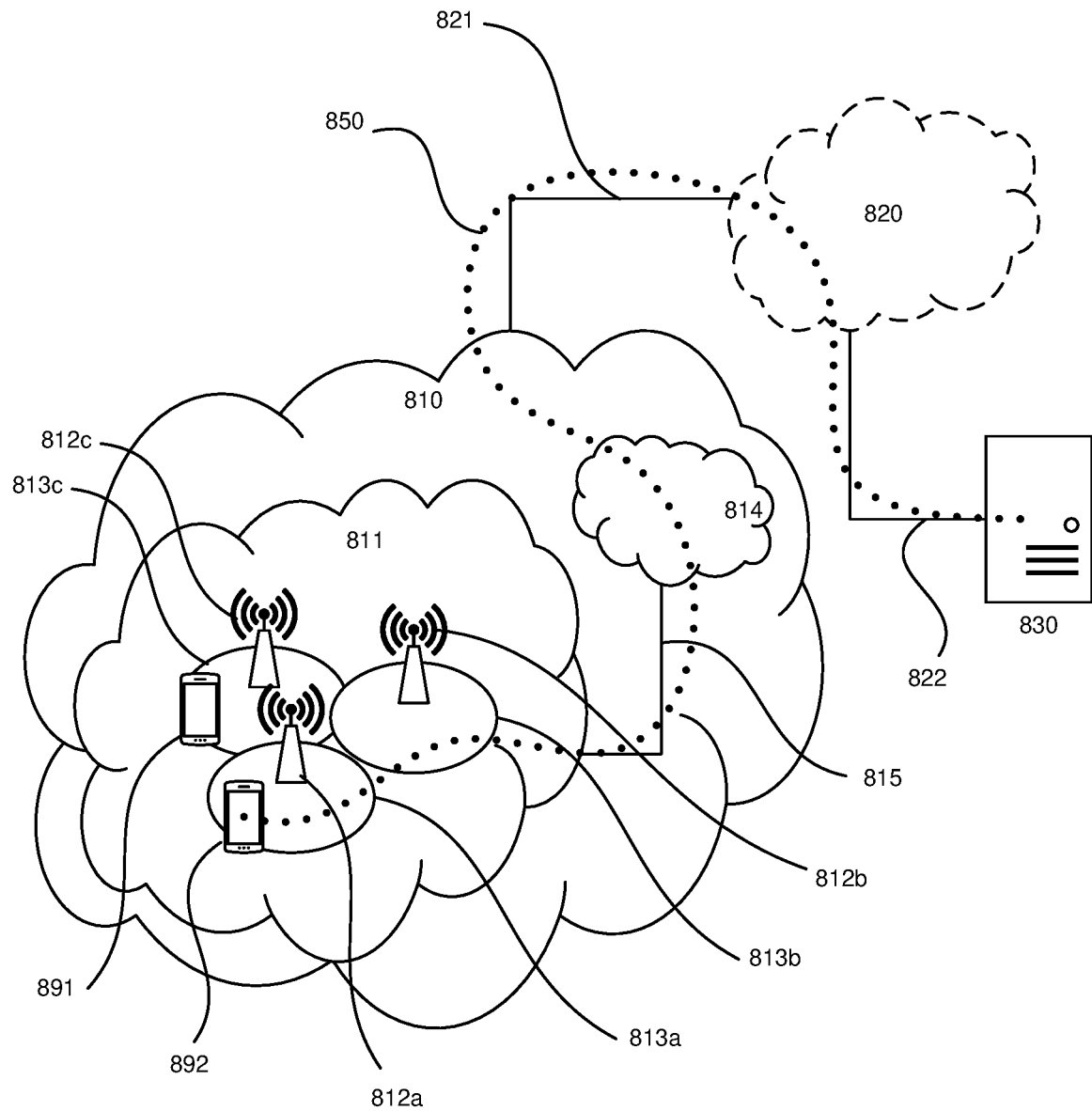
FIG. 17 is a block diagram illustrating a telecommunication network connected via an intermediate network to a host computer in accordance with some embodiments of the present disclosure.

FIG. 17 is a block diagram illustrating a telecommunication network connected via an intermediate network to a host computer in accordance with some embodiments of the present disclosure.

With reference to FIG. 17, in accordance with an embodiment, a communication system includes a telecommunication network 810, such as a 3GPP-type cellular network, which comprises an access network 811, such as a radio access network, and a core network 814. The access network 811 comprises a plurality of base stations 812*a*, 812*b*, 812*c*, such as NBs, eNBs, gNBs or other types of wireless access points, each defining a corresponding coverage area 813*a*, 813*b*, 813*c*. Each base station 812*a*, 812*b*, 812*c* is connectable to the core network 814 over a wired or wireless connection 815. A first UE 891 located in a coverage area 813*c* is configured to wirelessly connect to, or be paged by, the corresponding base station 812*c*. A second UE 892 in a coverage area 813*a* is wirelessly connectable to the corresponding base station 812*a*. While a plurality of UEs 891, 892 are illustrated in this example, the disclosed embodiments are equally applicable to a situation where a sole UE is in the coverage area or where a sole UE is connecting to the corresponding base station 812.

The telecommunication network 810 is itself connected to a host computer 830, which may be embodied in the hardware and/or software of a standalone server, a cloud-implemented server, a distributed server or as processing resources in a server farm. The host computer 830 may be under the ownership or control of a service provider, or may be operated by the service provider or on behalf of the service provider. Connections 821 and 822 between the telecommunication network 810 and the host computer 830 may extend directly from the core network 814 to the host computer 830 or may go via an optional intermediate network 820. An intermediate network 820 may be one of, or a combination of more than one of, a public, private or hosted network; the intermediate network 820, if any, may be a backbone network or the Internet; in particular, the intermediate network 820 may comprise two or more subnetworks (not shown).

The communication system of FIG. 17 as a whole enables connectivity between the connected UEs 891, 892 and the host computer 830. The connectivity may be described as an over-the-top (OTT) connection 850. The host computer 830 and the connected UEs 891, 892 are configured to communicate data and/or signaling via the OTT connection 850, using the access network 811, the core network 814, any intermediate network 820 and possible further infrastructure (not shown) as intermediaries. The OTT connection 850 may be transparent in the sense that the participating communication devices through which the OTT connection 850 passes are unaware of routing of uplink and downlink communications. For example, the base station 812 may not or need not be informed about the past routing of an incoming downlink communication with data originating from the host computer 830 to be forwarded (e.g., handed over) to a connected UE 891. Similarly, the base station 812 need not be aware of the future routing of an outgoing uplink communication originating from the UE 891 towards the host computer 830.

Figure 18:
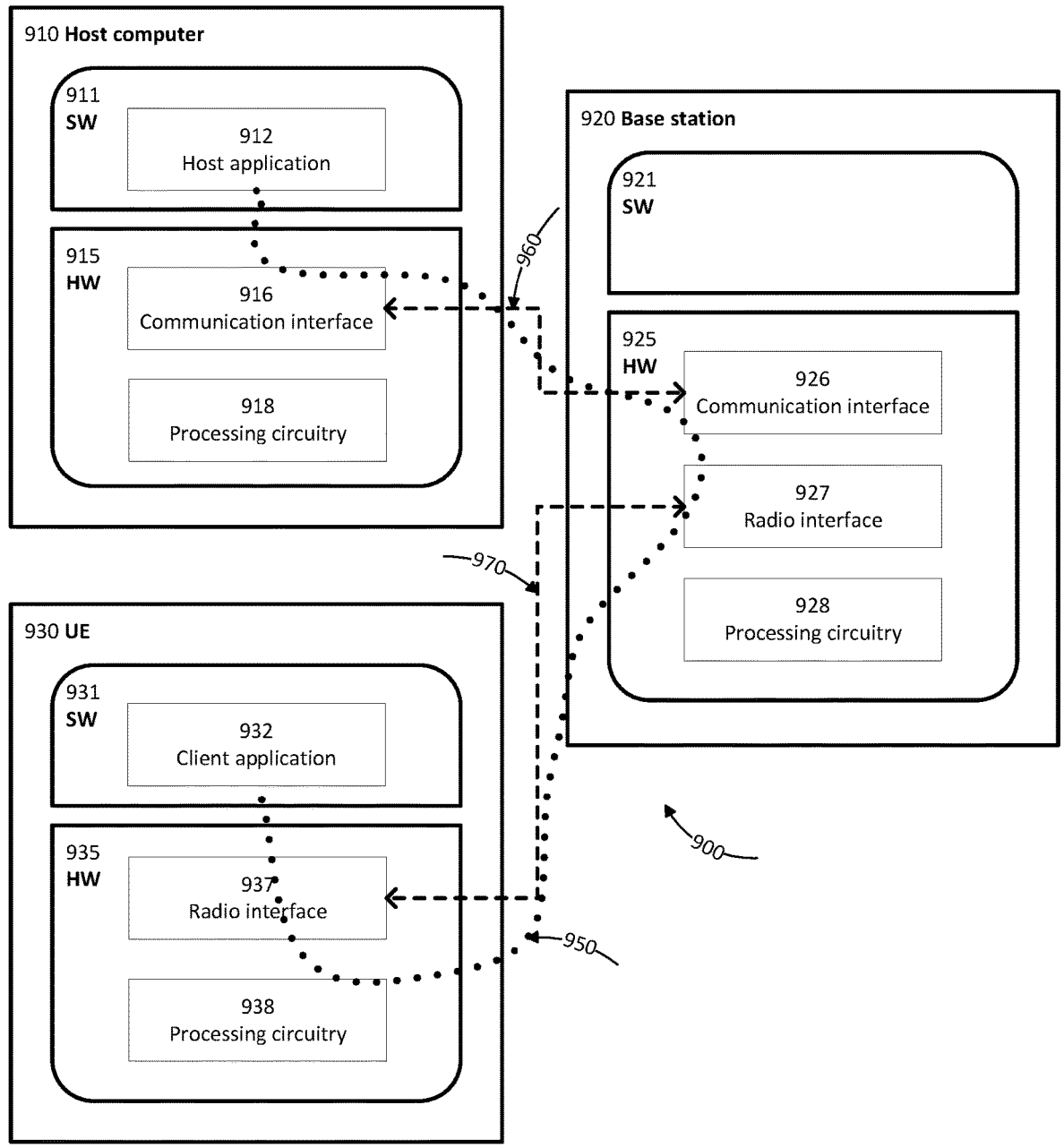
FIG. 18 is a block diagram illustrating a host computer communicating via a base station with a UE over a partially wireless connection in accordance with some embodiments of the present disclosure.

FIG. 18 is a block diagram illustrating a host computer communicating via a base station with a UE over a partially wireless connection in accordance with some embodiments of the present disclosure.

Example implementations, in accordance with an embodiment, of the UE, base station and host computer discussed in the preceding paragraphs will now be described with reference to FIG. 18. In a communication system 900, a host computer 910 comprises hardware 915 including a communication interface 916 configured to set up and maintain a wired or wireless connection with an interface of a different communication device of the communication system 900. The host computer 910 further comprises a processing circuitry 918, which may have storage and/or processing capabilities. In particular, the processing circuitry 918 may comprise one or more programmable processors, application-specific integrated circuits, field programmable gate arrays or combinations of these (not shown) adapted to execute instructions. The host computer 910 further comprises software 911, which is stored in or accessible by the host computer 910 and executable by the processing circuitry 918. The software 911 includes a host application 912. The host application 912 may be operable to provide a service to a remote user, such as UE 930 connecting via an OTT connection 950 terminating at the UE 930 and the host computer 910. In providing the service to the remote user, the host application 912 may provide user data which is transmitted using the OTT connection 950.

The communication system 900 further includes a base station 920 provided in a telecommunication system and comprising hardware 925 enabling it to communicate with the host computer 910 and with the UE 930. The hardware 925 may include a communication interface 926 for setting up and maintaining a wired or wireless connection with an interface of a different communication device of the communication system 900, as well as a radio interface 927 for setting up and maintaining at least a wireless connection 970 with the UE 930 located in a coverage area (not shown in FIG. 18) served by the base station 920. The communication interface 926 may be configured to facilitate a connection 960 to the host computer 910. The connection 960 may be direct or it may pass through a core network (not shown in FIG. 18) of the telecommunication system and/or through one or more intermediate networks outside the telecommunication system. In the embodiment shown, the hardware 925 of the base station 920 further includes a processing circuitry 928, which may comprise one or more programmable processors, application-specific integrated circuits, field programmable gate arrays or combinations of these (not shown) adapted to execute instructions. The base station 920 further has software 921 stored internally or accessible via an external connection.

The communication system 900 further includes the UE 930 already referred to. Its hardware 935 may include a radio interface 937 configured to set up and maintain a wireless connection 970 with a base station serving a coverage area in which the UE 930 is currently located. The hardware 935 of the UE 930 further includes a processing circuitry 938, which may comprise one or more programmable processors, application-specific integrated circuits, field programmable gate arrays or combinations of these (not shown) adapted to execute instructions. The UE 930 further comprises software 931, which is stored in or accessible by the UE 930 and executable by the processing circuitry 938. The software 931 includes a client application 932. The client application 932 may be operable to provide a service to a human or non-human user via the UE 930, with the support of the host computer 910. In the host computer 910, an executing host application 912 may communicate with the executing client application 932 via the OTT connection 950 terminating at the UE 930 and the host computer 910. In providing the service to the user, the client application 932 may receive request data from the host application 912 and provide user data in response to the request data. The OTT connection 950 may transfer both the request data and the user data. The client application 932 may interact with the user to generate the user data that it provides.

It is noted that the host computer 910, the base station 920 and the UE 930 illustrated in FIG. 18 may be similar or identical to the host computer 830, one of base stations 812a, 812b, 812c and one of UEs 891, 892 of FIG. 17, respectively. This is to say, the inner workings of these entities may be as shown in FIG. 18 and independently, the surrounding network topology may be that of FIG. 17.

In FIG. 18, the OTT connection 950 has been drawn abstractly to illustrate the communication between the host computer 910 and the UE 930 via the base station 920, without explicit reference to any intermediary devices and the precise routing of messages via these devices. Network infrastructure may determine the routing, which it may be configured to hide from the UE 930 or from the service provider operating the host computer 910, or both. While the OTT connection 950 is active, the network infrastructure may further take decisions by which it dynamically changes the routing (e.g., on the basis of load balancing consideration or reconfiguration of the network).

Wireless connection 970 between the UE 930 and the base station 920 is in accordance with the teachings of the embodiments described throughout this disclosure. One or more of the various embodiments improve the performance of OTT services provided to the UE 930 using the OTT connection 950, in which the wireless connection 970 forms the last segment. More precisely, the teachings of these embodiments may improve the latency and the power consumption, and thereby provide benefits such as lower complexity, reduced time required to access a cell, better responsiveness, extended battery lifetime, etc.

A measurement procedure may be provided for the purpose of monitoring data rate, latency and other factors on which the one or more embodiments improve. There may further be an optional network functionality for reconfiguring the OTT connection 950 between the host computer 910 and the UE 930, in response to variations in the measurement results. The measurement procedure and/or the network functionality for reconfiguring the OTT connection 950 may be implemented in software 911 and hardware 915 of the host computer 910 or in software 931 and hardware 935 of the UE 930, or both. In embodiments, sensors (not shown) may be deployed in or in association with communication devices through which the OTT connection 950 passes; the sensors may participate in the measurement procedure by supplying values of the monitored quantities exemplified above, or supplying values of other physical quantities from which the software 911, 931 may compute or estimate the monitored quantities. The reconfiguring of the OTT connection 950 may include message format, retransmission settings, preferred routing etc.; the reconfiguring need not affect the base station 920, and it may be unknown or imperceptible to the base station 920. Such procedures and functionalities may be known and practiced in the art. In certain embodiments, measurements may involve proprietary UE signaling facilitating the host computer 910's measurements of throughput, propagation times, latency and the like. The measurements may be implemented in that the software 911 and 931 causes messages to be transmitted, in particular empty or 'dummy' messages, using the OTT connection 950 while it monitors propagation times, errors etc.

Figure 19:
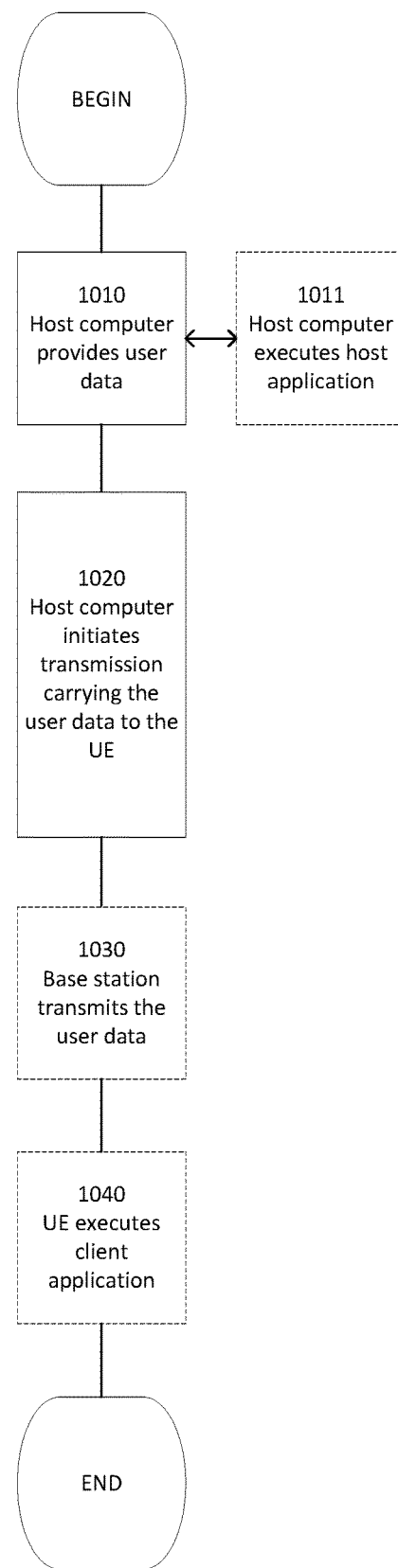
FIG. 19 is a flowchart illustrating a method implemented in a communication system, in accordance with an embodiment of the present disclosure.

FIG. 19 is a flowchart illustrating a method implemented in a communication system, in accordance with an embodiment. The communication system includes a host computer, a base station and a UE which may be those described with reference to FIG. 17 and FIG. 18. For simplicity of the present disclosure, only drawing references to FIG. 19 will be included in this section. In step 1010, the host computer provides user data. In substep 1011 (which may be optional) of step 1010, the host computer provides the user data by executing a host application. In step 1020, the host computer initiates a transmission carrying the user data to the UE. In step 1030 (which may be optional), the base station transmits to the UE the user data which was carried in the transmission that the host computer initiated, in accordance with the teachings of the embodiments described throughout this disclosure. In step 1040 (which may also be optional), the UE executes a client application associated with the host application executed by the host computer.

Figure 20:
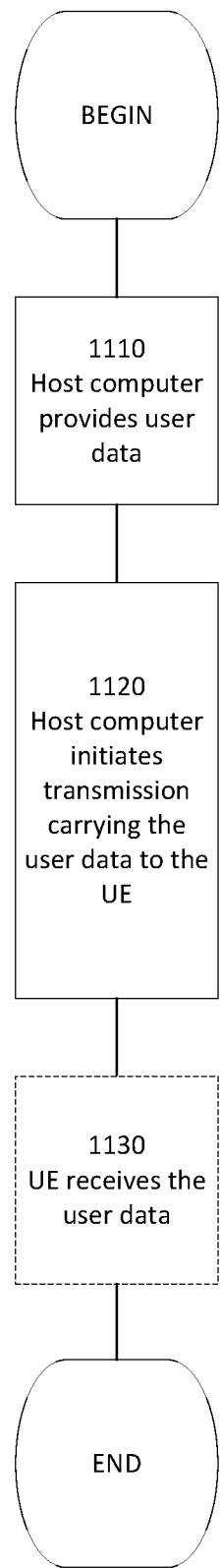
FIG. 20 is a flowchart illustrating a method implemented in a communication system, in accordance with an embodiment of the present disclosure.

FIG. 20 is a flowchart illustrating a method implemented in a communication system, in accordance with an embodiment. The communication system includes a host computer, a base station and a UE which may be those described with reference to FIG. 17 and FIG. 18. For simplicity of the present disclosure, only drawing references to FIG. 20 will be included in this section. In step 1110 of the method, the host computer provides user data. In an optional substep (not shown) the host computer provides the user data by executing a host application. In step 1120, the host computer initiates a transmission carrying the user data to the UE. The transmission may pass via the base station, in accordance with the teachings of the embodiments described throughout this disclosure. In step 1130 (which may be optional), the UE receives the user data carried in the transmission.

Figure 21:
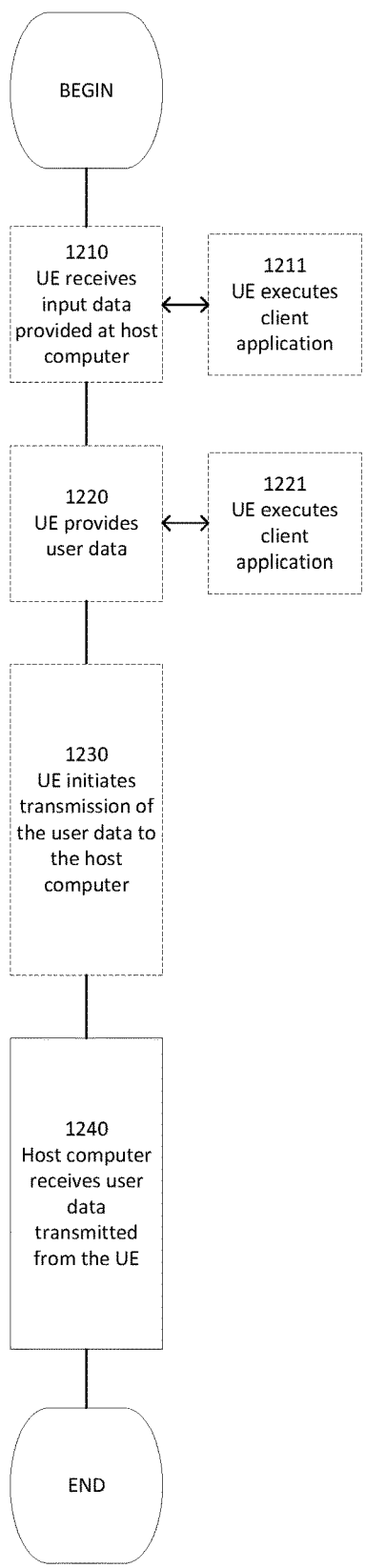
FIG. 21 is a flowchart illustrating a method implemented in a communication system, in accordance with an embodiment of the present disclosure.

FIG. 21 is a flowchart illustrating a method implemented in a communication system, in accordance with an embodiment. The communication system includes a host computer, a base station and a UE which may be those described with reference to FIG. 17 and FIG. 18. For simplicity of the present disclosure, only drawing references to FIG. 21 will be included in this section. In step 1210 (which may be optional), the UE receives input data provided by the host computer. Additionally or alternatively, in step 1220, the UE provides user data. In substep 1221 (which may be optional) of step 1220, the UE provides the user data by executing a client application. In substep 1211 (which may be optional) of step 1210, the UE executes a client application which provides the user data in reaction to the received input data provided by the host computer. In providing the user data, the executed client application may further consider user input received from the user. Regardless of the specific manner in which the user data was provided, the UE initiates, in substep 1230 (which may be optional), transmission of the user data to the host computer. In step 1240 of the method, the host computer receives the user data transmitted from the UE, in accordance with the teachings of the embodiments described throughout this disclosure.

Figure 22:
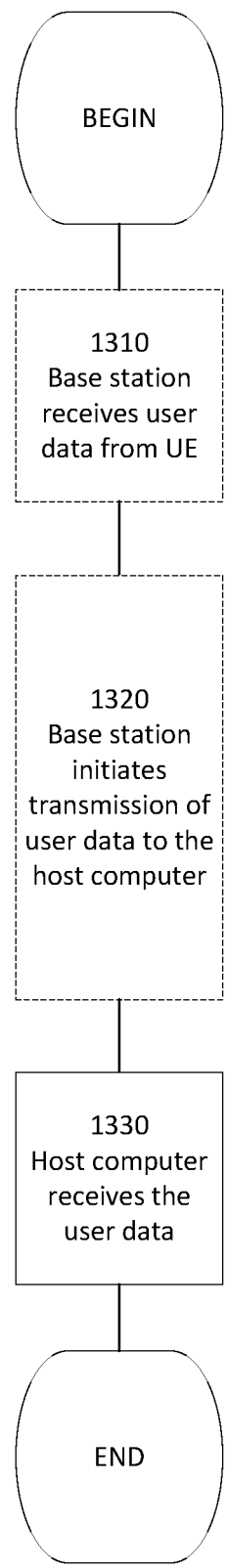
FIG. 22 is a flowchart illustrating a method implemented in a communication system, in accordance with an embodiment of the present disclosure.

FIG. 22 is a flowchart illustrating a method implemented in a communication system, in accordance with an embodiment. The communication system includes a host computer, a base station and a UE which may be those described with reference to FIG. 17 and FIG. 18. For simplicity of the present disclosure, only drawing references to FIG. 22 will be included in this section. In step 1310 (which may be optional), in accordance with the teachings of the embodiments described throughout this disclosure, the base station receives user data from the UE. In step 1320 (which may be optional), the base station initiates transmission of the received user data to the host computer. In step 1330 (which may be optional), the host computer receives the user data carried in the transmission initiated by the base station.

In general, the various exemplary embodiments may be implemented in hardware or special purpose chips, circuits, software, logic or any combination thereof. For example, some aspects may be implemented in hardware, while other aspects may be implemented in firmware or software which may be executed by a controller, microprocessor or other computing device, although the disclosure is not limited thereto. While various aspects of the exemplary embodiments of this disclosure may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

As such, it should be appreciated that at least some aspects of the exemplary embodiments of the disclosure may be practiced in various components such as integrated circuit chips and modules. It should thus be appreciated that the exemplary embodiments of this disclosure may be realized in an apparatus that is embodied as an integrated circuit, where the integrated circuit may comprise circuitry (as well as possibly firmware) for embodying at least one or more of a data processor, a digital signal processor, baseband circuitry and radio frequency circuitry that are configurable so as to operate in accordance with the exemplary embodiments of this disclosure.

It should be appreciated that at least some aspects of the exemplary embodiments of the disclosure may be embodied in computer-executable instructions, such as in one or more program modules, executed by one or more computers or other devices. Generally, program modules include routines, programs, objects, components, data structures, etc. that perform particular tasks or implement particular abstract data types when executed by a processor in a computer or other device. The computer executable instructions may be stored on a computer readable medium such as a hard disk, optical disk, removable storage media, solid state memory, random access memory (RAM), etc. As will be appreciated by one of skill in the art, the function of the program modules may be combined or distributed as desired in various embodiments. In addition, the function may be embodied in whole or partly in firmware or hardware equivalents such as integrated circuits, field programmable gate arrays (FPGA), and the like.

The present disclosure includes any novel feature or combination of features disclosed herein either explicitly or any generalization thereof. Various modifications and adaptations to the foregoing exemplary embodiments of this disclosure may become apparent to those skilled in the relevant arts in view of the foregoing description, when read in conjunction with the accompanying drawings. However, any and all modifications will still fall within the scope of the non-limiting and exemplary embodiments of this disclosure.

What is claimed is:

1. A method performed by a receiver, comprising:
   obtaining, based on received information and an original left-to-right table comprising left-to-right messages associated with nodes of a plurality of processing elements, PEs, for belief propagation, BP, decoding, an original right-to-left table comprising right-to-left messages associated with the nodes;
   searching for, based on the original left-to-right table and the original right-to-left table, a conflict verification processing element, VPE, in the plurality of PEs, the conflict VPE being a VPE for which the left-to-right messages associated with the most-left nodes affecting the left-to-right message associated with its left-upper node indicate frozen bits and the left-to-right messages associated with the most-left nodes affecting the left-to-right message associated with its left-lower node indicate frozen bits and information bits, and having a negative sign for the right-to-left message associated with its left-upper node;
   updating the original right-to-left table based on the conflict VPE to obtain a plurality of potential right-to-left tables; and
   performing the BP decoding based on the respective one of the plurality of potential right-to-left tables.

2. The method according to claim 1, wherein updating the original right-to-left table based on the conflict VPE to obtain a plurality of potential right-to-left tables comprises:
   modifying, for the conflict VPE and in the original right-to-left table, the sign of the right-to-left message associated with its left-upper node to be positive and the sign of the right-to-left message associated with its right-upper node to be the same as the sign of the right-to-left message associated with its right-lower node, to obtain a first potential right-to-left table; and
   modifying, for the conflict VPE and in the original right-to-left table, the sign of the right-to-left message associated with its left-upper node to be positive and the sign of the right-to-left message associated with its right-lower node to be the same as the sign of the right-to-left message associated with its right-upper node, to obtain a second potential right-to-left table.

3. The method according to claim 1, further comprising:
   searching for, in response to no BP decoding based on the respective one of the plurality of potential right-to-left tables being successful, a conflict PE which is connected leftwards to the found conflict VPE and has the right-to-left message associated with the left-upper node or the left-lower node changed or a new conflict VPE based on the respective potential right-to-left tables; and
   updating each of the potential right-to-left tables based on the respective conflict PE or the respective new conflict VPE;
   wherein the BP decoding is performed based on the respective one of the updated potential right-to-left tables.

4. The method according to claim 3, wherein updating each of the potential right-to-left tables based on the respective conflict PE comprises:
   in response to the right-to-left message associated with the conflict PE's left-upper node being changed,
   modifying, for the conflict PE and in the potential right-to-left table, the sign of the right-to-left message associated with its right-upper node based on the sign of the right-to-left message associated with its left-upper node and the sign of the right-to-left message associated with its right-lower node, to obtain a third potential right-to-left table; and
   modifying, for the conflict PE and in the potential right-to-left table, the sign of the right-to-left message associated with its right-lower node based on the sign of the right-to-left message associated with its left-upper node and the sign of the right-to-left message associated with its right-upper node, to obtain a fourth potential right-to-left table;
   in response to the right-to-left message associated with the conflict PE's left-lower node being changed,
   modifying, for the conflict PE and in the potential right-to-left table, the sign of the right-to-left message associated with its right-lower node to be same as the sign of the right-to-left message associated with its left-lower node, to obtain a fifth potential right-to-left table.

5. The method according to claim 1, wherein updating the original right-to-left table based on the conflict VPE to obtain a plurality of potential right-to-left tables comprises:
   modifying, for the conflict VPE and in the original right-to-left table, the sign of the right-to-left message associated with its left-upper node to be positive and the sign of the right-to-left message associated with its right-upper node to be the same as the sign of the right-to-left message associated with its right-lower node, to obtain a first intermediate right-to-left table;
   modifying, for the conflict VPE and in the original right-to-left table, the sign of the right-to-left message associated with its left-upper node to be positive and the sign of the right-to-left message associated with its right-lower node to be the same as the sign of the right-to-left message associated with its right-upper node, to obtain a second intermediate right-to-left table;
   searching each of the first intermediate right-to-left table and the second intermediate right-to-left table for a conflict PE which is connected leftwards to the found conflict VPE and has the right-to-left message associated with the left-upper node or the left-lower node changed;

for each of the first intermediate right-to-left table and the second intermediate right-to-left table, in response to the right-to-left message associated with the respective conflict PE's left-upper node being changed, modifying, for the respective conflict PE, the sign of the right-to-left message associated with its right-upper node based on the sign of the right-to-left message associated with its left-upper node and the sign of the right-to-left message associated with its right-lower node, to obtain a first potential right-to-left table; and modifying, for the respective conflict PE, the sign of the right-to-left message associated with its right-lower node based on the sign of the right-to-left message associated with its left-upper node and the sign of the right-to-left message associated with its right-upper node, to obtain a second potential right-to-left table;

in response to the right-to-left message associated with the respective conflict PE's left-lower node being changed, modifying, for the respective conflict PE, the sign of the right-to-left message associated with its right-lower node to be same as the sign of the right-to-left message associated with its left-lower node, to obtain a third potential right-to-left table.

6. The method according to claim 3, further comprising:
searching for, in response to no BP decoding based on the respective one of the potential right-to-left tables or the updated potential right-to-left tables being successful, a further conflict PE which is connected leftwards to the previously found conflict PE and has the right-to-left message associated with the left-upper node or the left-lower node changed or a new conflict VPE based on the respective one of the potential right-to-left tables or the updated potential right-to-left tables; and updating each of the potential right-to-left tables or the updated potential right-to-left tables based on the respective further conflict PE or the new conflict VPE;

wherein the BP decoding is performed based on the respective one of the newly updated potential right-to-left tables.

7. The method according to claim claim 1, further comprising prior to searching the conflict PE or the new conflict VPE:
determining whether an amount N of the potential right-to-left tables is greater than a predetermined number;
calculating, in response to the amount of the potential right-to-left tables being greater than the predetermined number, a power metric for each BP decoding which was performed based on the respective potential right-to-left table; and
retaining the predetermined number of potential right-to-left tables corresponding to the smaller power metrics;
wherein the searching of the conflict PE or the new conflict VPE is performed on the retained potential right-to-left tables.

8. The method according to claim 7, wherein the power metric for the BP decoding is calculated as follows:

$$PM(l) = \sum_{k\_frozen=1}^{N\_frozen} \ln\left(1 + e^{-llr_{k\_frozen}(l)}\right)$$

where PM(l) represents the power metric for the $l^{th}$ BP decoding, l is in a range from 1 to 2*N and comprising 1 and 2*N, N_frozen represents a total number of the most-left nodes indicating the frozen bit, $llr_{k\_frozen}(l)$ represents the right-to-left message associated with the k_frozen$^{th}$ most-left node which indicates the frozen bit in the form of logarithmic likelihood ratio, LLR in the last right-to-left table during the BP decoding, and ln(•) represents a logarithmic function with base e.

9. The method according to claim 1, further comprising prior to obtaining the original right-to-left table:
performing the BP decoding on the received information;
wherein the obtaining of the original right-to-left table is performed in response to the BP decoding being unsuccessful.

10. The method according to claim 1, wherein the BP decoding is determined as being unsuccessful if one of the followings is satisfied:
a) iteration times of the BP decoding exceed maximum iteration times; and
b) the current left-to-right table and the current right-to-left table are identical to the previous left-to-right table and the previous right-to-left table respectively.

11. The method according to claim 1, wherein the left-to-right message and the right-to-left message are in the form of logarithmic likelihood ratio, LLR.

12. The method according to claim 11, wherein the left-to-right messages in the original left-to-right table are calculated as follows:

$$R_{i+1,j0}=f(R_{i,j2},R_{i,j3}),$$

$$R_{i+1,j1}=R_{i,j3},$$

$$f(a,b)=\text{sign}(a*b)*\min(|a|,|b|),$$

where $R_{i+1,j0}$ presents the left-to-right message associated with the right-upper node of the PE, $R_{i+1,j1}$ represents the left-to-right message associated with the right-lower node of the PE, $R_{i,j2}$ represents the left-to-right message associated with the left-upper node of the PE, $R_{i,j3}$ represents the left-to-right message associated with the left-lower node of the PE, sign(•) represents a sign function, and min(•) represents a minimum function; and wherein the left-to-right messages associated with the most-left nodes are set based on bit positions of information bits and frozen bits in a source bit sequence from which the received information is originated, wherein the left-to right message associated with the most-left node indicating the information bit is set to a first value and the left-to-right message associated with the most-left node indicating the frozen bit is set to a second value.

13. The method according to claim 12, wherein the right-to-left message in the original right-to-left table is calculated as follows:

$$L_{i,j2}=f(R_{i,j3}+L_{i+1,j1},L_{i+1,j0}),$$

$$L_{i,j3}=f(R_{i,j2},L_{i+1,j0})+L_{i+1,j1},$$

$$f(a,b)=\text{sign}(a*b)*\min(|a|,|b|),$$

where $L_{i,j2}$ represents the right-to-left message associated with the left-upper node of the PE, $L_{i,j3}$ represents the right-to-left message associated with the left-lower node of the PE, $L_{i+1,j0}$ represents the right-to-left message associated with the right-upper node of the PE, $L_{i+1,j1}$ represents the right-to-left message associated with the right-lower node of the PE, sign(•) represents a sign function, and min(•) represents a minimum function; and wherein the right-to-left messages associated with the most-right nodes are set to the received information.

14. The method according to claim 11, wherein searching for the conflict VPE comprises:
- checking, for each of the plurality PEs and based on the left-to-right table, the left-to-right messages associated with the left-upper node and the left-lower node;
- determining the PE of which the left-to-right message associated with its left-upper node has a larger value than the left-to-right message associated with its left-lower node as a VPE;
- checking, for the VPE and based on the right-to-left table, whether the right-to-left message associated with the left-upper node has a negative sign; and
- determining, in response to the right-to-left message associated with the left-upper node having the negative sign, the VPE as the conflict VPE.

15. The method according to claim 14, wherein the searching of the conflict VPE is performed starting from the most-right PEs.

16. A receiver comprising:
- one or more processors; and
- one or more memories comprising computer program codes,
- the one or more memories and the computer program codes configured to, with the one or more processors, cause the receiver to:
- obtain, based on the received information and an original left-to-right table comprising left-to-right messages associated with nodes of a plurality of processing elements, PEs, for BP decoding, an original right-to-left table comprising right-to-left messages associated with the nodes;
- search for, based on the original left-to-right table and the original right-to-left table, a conflict verification processing element, VPE, in the plurality of PEs, the conflict VPE being a VPE for which the left-to-right messages associated with the most-left nodes affecting the left-to-right message associated with its left-upper node indicate frozen bits and the left-to-right messages associated with the most-left nodes affecting the left-to-right message associated with its left-lower node indicate frozen bits and information bits, and having a negative sign for the right-to-left message associated with its left-upper node;
- update the original right-to-left table based on the conflict VPE to obtain a plurality of potential right-to-left tables; and
- perform the BP decoding based on the respective one of the plurality of potential right-to-left tables.

17. The receiver according to claim 16, wherein the one or more memories and the computer program codes are further configured to, with the one or more processors, cause the receiver to update the original right-to-left table based on the conflict VPE to obtain a plurality of potential right-to-left tables by:
- modifying, for the conflict VPE and in the original right-to-left table, the sign of the right-to-left message associated with its left-upper node to be positive and the sign of the right-to-left message associated with its right-upper node to be the same as the sign of the right-to-left message associated with its right-lower node, to obtain a first potential right-to-left table; and
- modifying, for the conflict VPE and in the original right-to-left table, the sign of the right-to-left message associated with its left-upper node to be positive and the sign of the right-to-left message associated with its right-lower node to be the same as the sign of the right-to-left message associated with its right-upper node, to obtain a second potential right-to-left table.

18. A receiver comprising:
- a belief propagation, BP, decoder configured to perform BP decoding; and
- a BP conflict search list circuitry configured to:
- obtain, based on the received information and an original left-to-right table comprising left-to-right messages associated with nodes of a plurality of processing elements, PEs, for the BP decoding, an original right-to-left table comprising right-to-left messages associated with the nodes;
- search for, based on the original left-to-right table and the original right-to-left table, a conflict verification processing element, VPE, in the plurality of PEs, the conflict VPE being a VPE for which the left-to-right messages associated with the most-left nodes affecting the left-to-right message associated with its left-upper node indicate frozen bits and the left-to-right messages associated with the most-left nodes affecting the left-to-right message associated with its left-lower node indicate frozen bits and information bits, and having a negative sign for the right-to-left message associated with its left-upper node; and
- update the original right-to-left table based on the conflict VPE to obtain a plurality of potential right-to-left tables; and
- wherein the BP decoder is further configured to perform the BP decoding based on the respective one of the plurality of potential right-to-left tables.

19. The receiver according to claim 18, wherein the BP conflict search list circuitry is further configured to update the original right-to-left table based on the conflict VPE to obtain a plurality of potential right-to-left tables by:
- modifying, for the conflict VPE and in the original right-to-left table, the sign of the right-to-left message associated with its left-upper node to be positive and the sign of the right-to-left message associated with its right-upper node to be the same as the sign of the right-to-left message associated with its right-lower node, to obtain a first potential right-to-left table; and
- modifying, for the conflict VPE and in the original right-to-left table, the sign of the right-to-left message associated with its left-upper node to be positive and the sign of the right-to-left message associated with its right-lower node to be the same as the sign of the right-to-left message associated with its right-upper node, to obtain a second potential right-to-left table.

* * * * *